United States Patent
Gilchrist et al.

(10) Patent No.: US 9,881,825 B2
(45) Date of Patent: Jan. 30, 2018

(54) REDUCED CAPACITY CARRIER AND METHOD OF USE

(71) Applicant: Brooks Automation, Inc., Chelmsford, MA (US)

(72) Inventors: Ulysses Gilchrist, Reading, MA (US); Michael L. Bufano, Belmont, MA (US); William Fosnight, Saratoga Springs, NY (US); Christopher Hofmeister, Holderness, NH (US); Gerarld M. Friedman, New Ipswich, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 142 days.

(21) Appl. No.: 14/541,934

(22) Filed: Nov. 14, 2014

(65) Prior Publication Data

US 2015/0155192 A1 Jun. 4, 2015

Related U.S. Application Data

(63) Continuation of application No. 11/207,231, filed on Aug. 19, 2005, now Pat. No. 8,888,433.

(Continued)

(51) Int. Cl.
*H01L 21/677* (2006.01)
*H01L 21/673* (2006.01)

(52) U.S. Cl.
CPC .... *H01L 21/67763* (2013.01); *H01L 21/6779* (2013.01); *H01L 21/67326* (2013.01);

(Continued)

(58) Field of Classification Search
CPC ......... H01L 21/67383; H01L 21/67763; H01L 21/67775; H01L 21/67778
See application file for complete search history.

(56) References Cited

U.S. PATENT DOCUMENTS

| 4,724,874 A | 2/1988 | Parikh et al. |
|---|---|---|
| 4,995,430 A | 2/1991 | Bonora et al. |

(Continued)

FOREIGN PATENT DOCUMENTS

| JP | 61228647 | 10/1986 |
|---|---|---|
| JP | 10270526 | 9/1998 |

(Continued)

OTHER PUBLICATIONS

European Search Report, EP Application No. 05791673, dated Aug. 30, 2011.

*Primary Examiner* — James Keenan
(74) *Attorney, Agent, or Firm* — Perman & Green, LLP; Colin C. Durham

(57) ABSTRACT

A substrate transport apparatus is provided. The apparatus has a casing and a door. The casing is adapted to form a controlled environment therein. The casing has supports therein for holding at least one substrate in the casing. The casing defines a substrate transfer opening through which a substrate transport system accesses the substrate in the casing. The door is connected to the casing for closing the substrate transfer opening in the casing. The casing has structure forming a fast swap element allowing replacement of the substrate from the apparatus with another substrate without retraction of the substrate transport system and independent of substrate loading in the casing.

11 Claims, 21 Drawing Sheets

Related U.S. Application Data

(60) Provisional application No. 60/603,361, filed on Aug. 19, 2004.

(52) U.S. Cl.
CPC .. *H01L 21/67353* (2013.01); *H01L 21/67369* (2013.01); *H01L 21/67373* (2013.01); *H01L 21/67376* (2013.01); *H01L 21/67383* (2013.01); *H01L 21/67389* (2013.01); *H01L 21/67393* (2013.01); *H01L 21/67772* (2013.01); *H01L 21/67778* (2013.01); *Y10S 414/139* (2013.01)

(56) References Cited

U.S. PATENT DOCUMENTS

| | | | |
|---|---|---|---|
| 5,097,421 | A | 3/1992 | Maney et al. |
| 5,370,491 | A | 12/1994 | Bonora et al. |
| 5,372,471 | A | 12/1994 | Wu |
| 5,377,476 | A | 1/1995 | Bohmer et al. |
| 5,486,080 | A | 1/1996 | Sieradzki |
| 5,611,452 | A | 3/1997 | Bonora et al. |
| 5,988,233 | A | 11/1999 | Fosnight et al. |
| 6,158,946 | A | 12/2000 | Miyashita |
| 6,203,268 | B1 | 3/2001 | Miyashita |
| 6,244,812 | B1 | 6/2001 | Patterson et al. |
| 6,273,664 | B1 | 8/2001 | Doche |
| 6,390,754 | B2 | 5/2002 | Yamagama et al. |
| 6,341,806 | B1 | 8/2002 | Doche |
| 6,517,304 | B1 | 2/2003 | Matsumoto |
| 6,530,736 | B2 | 3/2003 | Rosenquist |
| 6,612,797 | B1 | 9/2003 | Bonora et al. |
| 6,633,050 | B1 | 10/2003 | Lyon |
| 6,643,558 | B2 | 11/2003 | Huber et al. |
| 6,691,416 | B2 | 2/2004 | Yu Chen |
| 6,719,142 | B1 | 4/2004 | Menear et al. |
| 6,745,901 | B2 | 6/2004 | Chen et al. |
| 6,808,352 | B2 | 10/2004 | Seita |
| 6,826,451 | B2 | 11/2004 | del Puerto et al. |
| 7,328,836 | B2 | 2/2008 | Hsueh et al. |
| 7,806,643 | B2 | 10/2010 | Friedman et al. |
| 2001/0019408 | A1 | 9/2001 | Hagler |
| 2002/0106267 | A1 | 8/2002 | Fujii et al. |
| 2003/0077153 | A1 | 4/2003 | Elliott et al. |
| 2003/0162462 | A1 | 5/2003 | Lee et al. |
| 2004/0024489 | A1 | 2/2004 | Fujiki et al. |
| 2005/0118000 | A1 | 6/2005 | Kasai et al. |
| 2005/0284535 | A1 | 12/2005 | Speasl et al. |

FOREIGN PATENT DOCUMENTS

| | | |
|---|---|---|
| JP | 11186366 | 7/1999 |
| JP | 2000223554 | 8/2000 |
| JP | 2001210700 | 8/2001 |
| JP | 2003258077 | 9/2003 |
| WO | 2006023838 | 3/2006 |

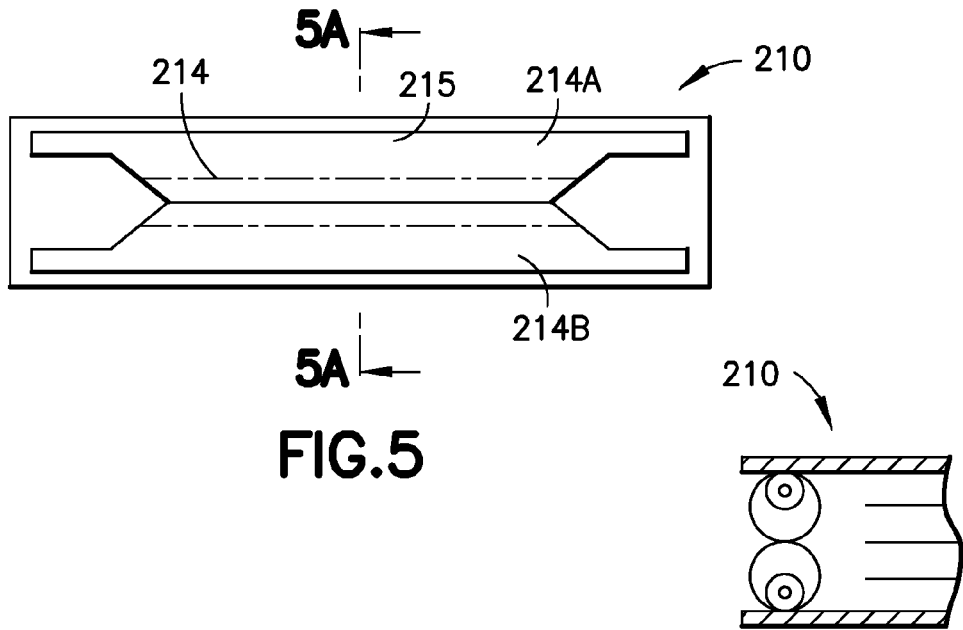
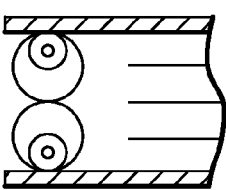
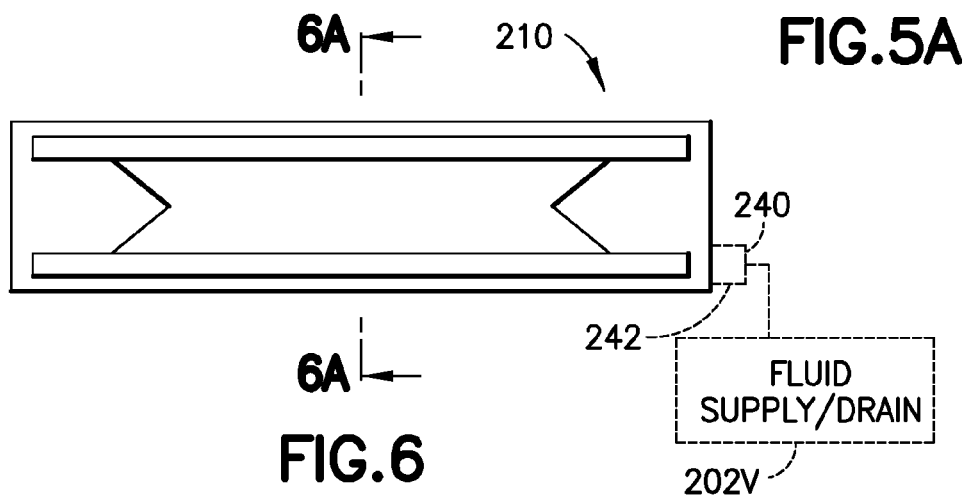
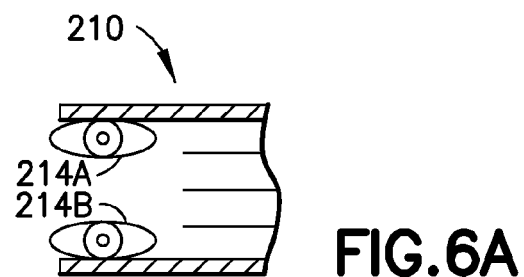

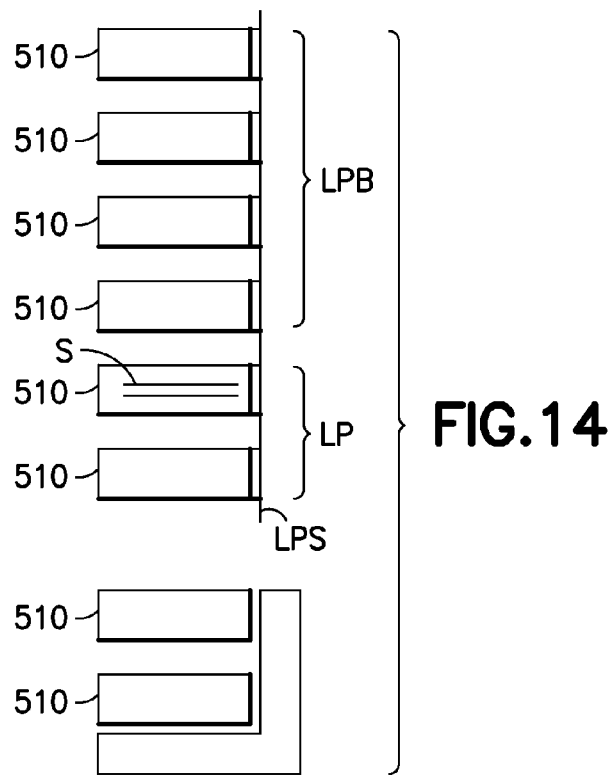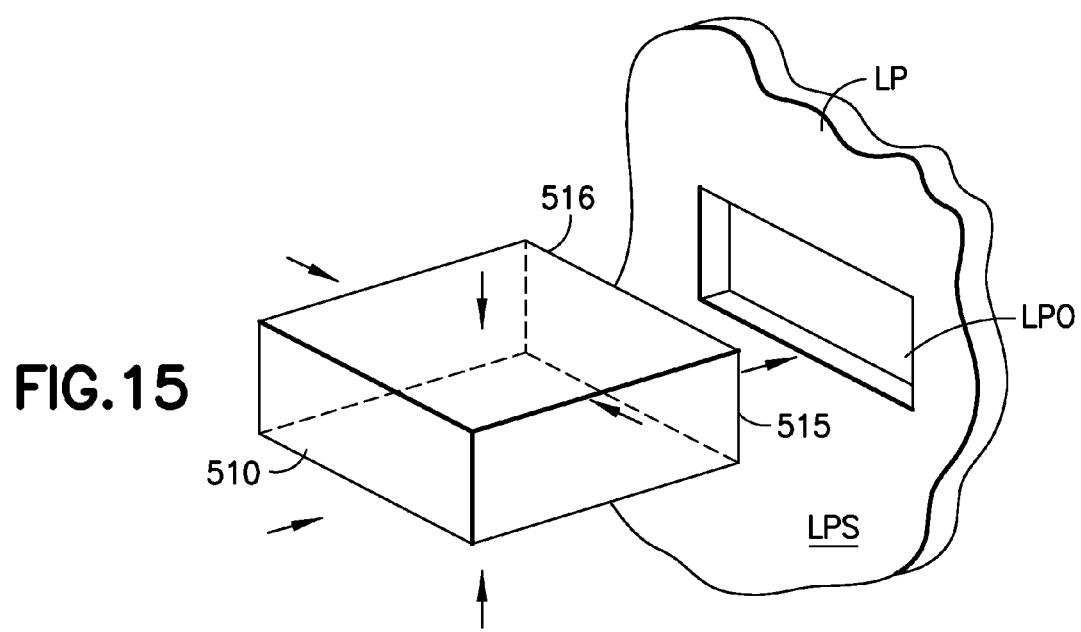

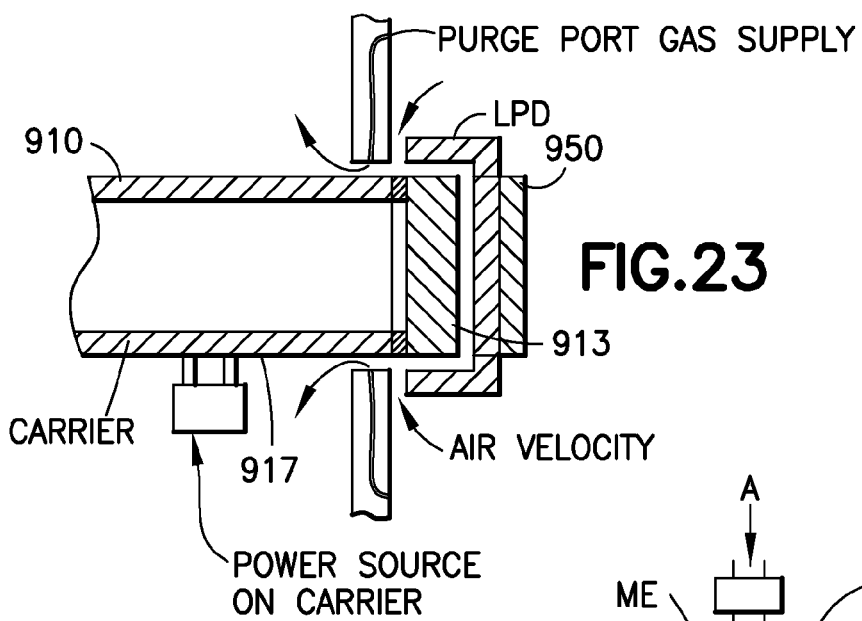
FIG.23
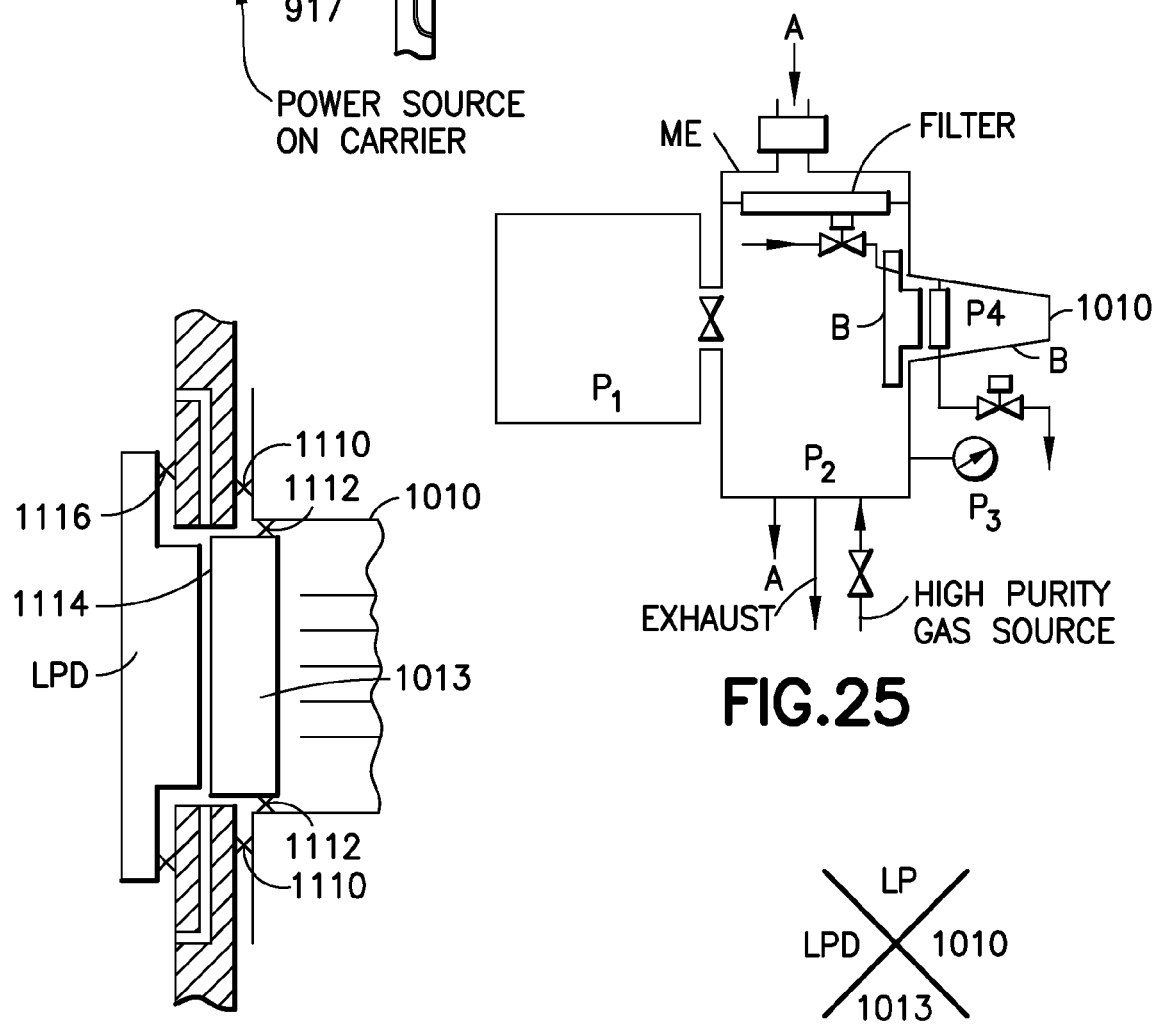
FIG.25
FIG.25A
FIG.25B

REDUCED CAPACITY CARRIER AND METHOD OF USE

CROSS-REFERENCE TO RELATED APPLICATION(S)

This application is a continuation of U.S. patent application Ser. No. 11/207,231 filed on Aug. 19, 2005 which is a non-provisional of and claims the benefit of U.S. Provisional Application No. 60/603,361 filed Aug. 19, 2004, the disclosures of which are incorporated by reference herein in their entirety.

BACKGROUND OF THE INVENTION

1. Field of the Invention

An apparatus and method is disclosed for a reduced-capacity substrate carriers for use within an IC fab. Side-opening carriers with a capacity of fewer than the conventional 13 or 25 wafers may be constructed in a manner similar to the FOUP defined in SEMI E47, but characterized by reduced height and weight.

2. Brief Description of Related Developments

There is a move in the semiconductor industry to reduce wafer cycle time through the fab and reduce the amount of work in progress as well as to improve wafer safety. Studies have shown that by moving to a single wafer carrier, wafer cycle time and WIP is significantly reduced. In addition for the next generation wafer size (450 mm) the ITRS roadmap calls for single substrate carriers. Benefits of using single wafer or reduced capacity carriers include WIP reduction, process changeover time reduction and product ramp time improvement. Problems arise where single substrate carriers are employed relative to the ability of both the process tool and material transport system to effectively maintain the higher pace of the factory due to the larger number of carrier transport moves as compared to 13 or 25 wafer carriers. One example of such a problem includes where there is only one slot. It is desired that the robot in the process tool have the capability to quickly swap (fast swap) the wafer in the carrier so the carrier may be able to be replaced with another carrier that has an unprocessed wafer to keep the tool busy. Many such tools do not have the ability to fast swap, as in the case of a conventional single blade three axis robot. Another example of such a problem includes where there is only one slot. It is desired that the material transport system transporting carrier to tools in the IC FAB have the capability to supply carriers, at a high rate and quickly swap the carriers at the process tools load port(s) so that one carrier at the tool may be able to be replaced with another carrier that has an unprocessed wafer to keep the tool busy. Many such material transport systems do not have the ability to supply carriers at a high rate or with the capability to fast swap, as in the case of a conventional (overhead transport) OHT based material transport systems as implemented in conventional 300 mm fabs. Accordingly, there is a desire to provide a carrier and methods of using the carrier that facilitates the higher carrier move rates.

Examples of transport systems, carriers and openers may be found in U.S. Pat. Nos. 6,047,812; RE38,221 E; 6,461,094; 6,520,338; 6,726,429; 5,980,183; and United States Patent Publications 2004/0062633, 2004/0081546, 2004/0081545; 2004/0076496 all of which are incorporated by reference herein in their entirety.

SUMMARY OF THE EXEMPLARY EMBODIMENTS

In accordance with one exemplary embodiment, a substrate transport apparatus is provided. The apparatus has a casing and a door. The casing is adapted to form a controlled environment therein. The casing has supports therein for holding at least one substrate in the casing. The casing defines a substrate transfer opening through which a substrate transport system accesses the substrate in the casing. The door is connected to the casing for closing the substrate transfer opening in the casing. The casing has structure forming a fast swap element allowing replacement of the substrate from the apparatus with another substrate without retraction of the substrate transport system and independent of substrate loading in the casing.

In accordance with another exemplary embodiment, a method for processing workpieces in a FAB is provided. The method comprises providing the FAB with workpiece processing stations defining a workpiece processing stream in which workpieces are processed in lots. The method further comprises providing a carrier for carrying one or more workpieces between workpiece processing stations in the workpiece processing stream. The carrier has predetermined workpiece holding areas each of which is adapted for holding a workpiece. The method also comprises establishing with the carrier a virtual workpiece lot having a selectable number of workpieces, for transport by the carrier from one workpiece processing station to another workpiece processing station in the workpiece processing stream.

BRIEF DESCRIPTION OF THE DRAWINGS

The foregoing aspects and other features of the present invention are explained in the following description, taken in connection with the accompanying drawings, wherein:

FIGS. 5-5A are respectively an elevation view of a closable opening in the transport apparatus, and a partial cross-sectional view of the opening, both views showing the closable opening in a first condition;

FIGS. 6-6A are respectively another elevation view and another partial cross-sectional view showing the opening in another condition;

FIG. 14 is a schematic elevation of a number of substrate transport apparatus in accordance with another exemplary embodiment and a load port interface of a substrate processing apparatus;

FIG. 15 is a schematic perspective view of one substrate transport apparatus and load port interface opening shown in FIG. 14;

FIG. 23 is a schematic cross-section view of the transport apparatus in FIG. 22, showing the apparatus docked to a load port interface;

FIG. 25 is a schematic elevation view of a substrate processing tool and a substrate transport apparatus mated to the tool in accordance with still yet another exemplary embodiment.

FIG. 25A is a partial elevation view of the transport apparatus interfaced to the tool in FIG. 25; and FIG. 25B is a schematic view of a sealing interface between the transport apparatus, the transport apparatus door, the frame of the loading port on the process tool and the loading port door of the process tool in FIG. 25.

DETAILED DESCRIPTION OF THE PREFERRED EMBODIMENTS

Figure 1A:
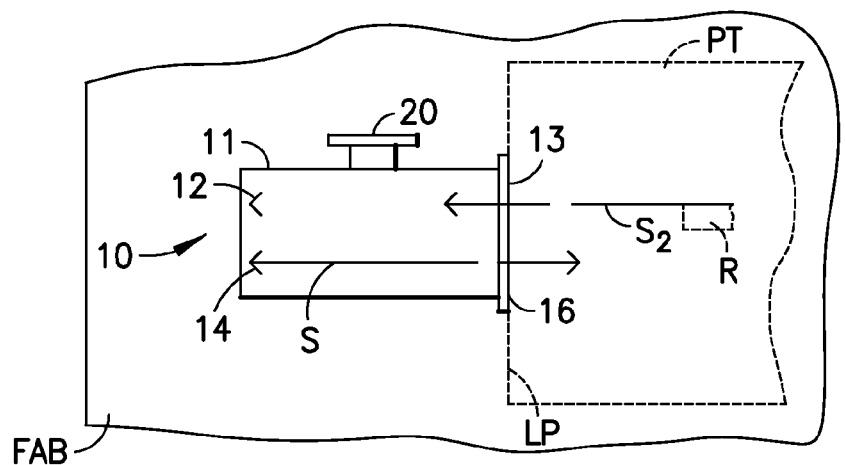
FIGS. 1A-1B are respectively a side elevation view of a substrate transport apparatus, incorporating features in accordance with an exemplary embodiment, and a substrate processing tool, and a plan view of the transport apparatus and a number of the processing tool in an IC FAB.

Referring to FIG. 1A, a schematic elevation view of a substrate transport apparatus or substrate carrier 10 incorporating features of the disclosed embodiments, and substrate processing apparatus PT located in a fabrication facility or FAB is illustrated. Although the embodiments disclosed will be described with reference to the embodiments shown in the drawings, it should be understood that the embodiments disclosed can be embodied in many alternate forms of embodiments. In addition, any suitable size, shape or type of elements or materials could be used.

The carrier 10 and substrate processing apparatus PT illustrated in FIG. 1A are merely representative, and the features of the present invention as described with respect to the exemplary embodiments disclosed herein are equally applicable to any other suitable carrier and processing apparatus. The substrate processing apparatus may be of any desired type such as a substrate processing tool, a stocker or a sorter. One example of a suitable substrate processing tool is the GX series processing tool available from Brooks Automation, Inc. The processing apparatus, or as may also be referred to herein, processing tool PT may have a casing or enclosure defining an interior space or chamber(s) in which the chamber atmosphere is capable of being controlled relative to the atmosphere exterior to the tool. The atmosphere in the chamber may be controlled in any desired manner. For example the processing tool PT chamber may have fan filtration unit(s) (not shown) capable of introducing highly filtered (i.e. clean room quality) air into the chamber to establish and maintain a clean room atmosphere therein suitable for IC fabrication to line widths with 45 nm node or less. In alternate embodiments, the chamber may be capable of isolating the interior atmosphere from that exterior. In such embodiments, the chamber may hold an inert gas atmosphere or may hold a vacuum. As seen in FIG. 1A, the processing tool PT has a loading interface or load port LP allowing substrates to be loaded and unloaded from the tool without compromising the interior atmosphere. As may be realized, the load port LP as will be described in greater detail below, may have an opening(s) therein through which substrates S1, S2 may be transferred into and out of the tool PT. The load port LP may also have a closure (not shown) capable of closing or blocking the opening, at least sufficiently to maintain the chamber interior atmosphere uncompromised, when the opening is otherwise exposed to the exterior atmosphere.

Figure 1B:
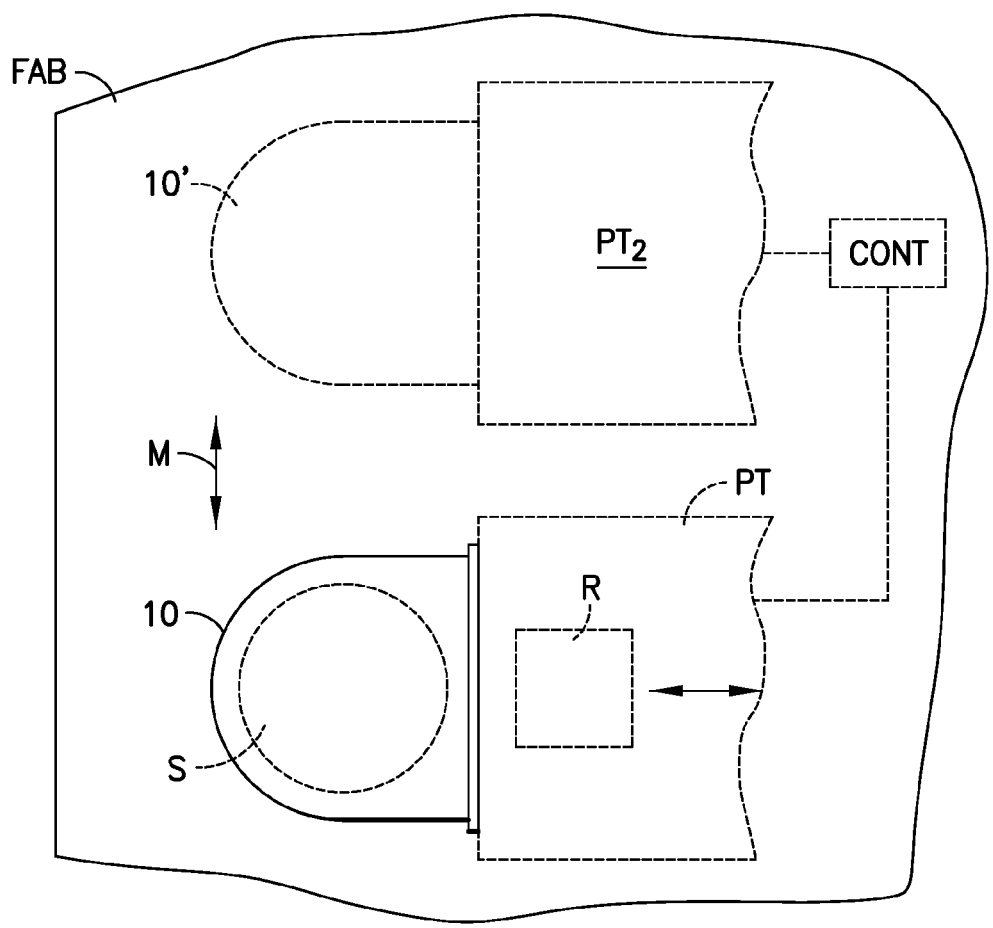

As seen in FIG. 1A, the substrates S may be transported to and from the processing tool(s) PT in carrier 10. The carrier 10 may have a casing capable of providing a controlled environment therein to prevent undesired contamination to the substrate(s) S when transported between processing tools in the FAB. Referring now also to FIG. 1B, there is shown a plan view of a portion of the FAB and representative processing tools PT, PT2. The processing tools PT, PT2 may be generally similar in that both are capable of performing some kind of processing/handling of substrate(s) S according to a fabrication protocol established in the FAB. The processing tools PT, PT2 may be located in any desired manner in FAB but are shown for example in FIG. 1B as being located adjacent each other to graphically illustrate the relationship between the processing tools PT,PT2 in the reference frame of the fabrication protocol for the substrates, indicated by arrow M in FIG. 1B. Thus, in this exemplary embodiment PT2 represents any processing tool located (or rather reached) in the fabrication process after processing tool PT. A controller CONT controls the tools PT, PT2 and moves carrier 10 in accordance with programming to carry out protocol M.

The carrier 10 is a reduced capacity carrier as will be described further below. The carrier 10 may be interfaced with the load port of the processing tool PT, PT2 to allow substrates to be transported from carrier to tool and vice versa. The tool PT may have a robot R capable of transporting substrates between tool and carrier through the load port opening. The robot may be of any suitable type, for example a scara or 3-axis robot with a single end effector. The robot is capable of being moved to an extended position (in which the end effector is positioned to pick/place substrates in the carrier) and has a retracted or battery position. The carrier 10 has a fast swap element allowing the robot to swap substrates without having to retract to battery as will be described further below. The carrier 10 may also provide a substrate buffer to the processing tool as will also be described further below. Further, the carrier 10 may have substrate slots to allow the load in the carrier 10 to be varied to form virtual substrate lots between processing tools, as will also be described below.

Figure 2A:
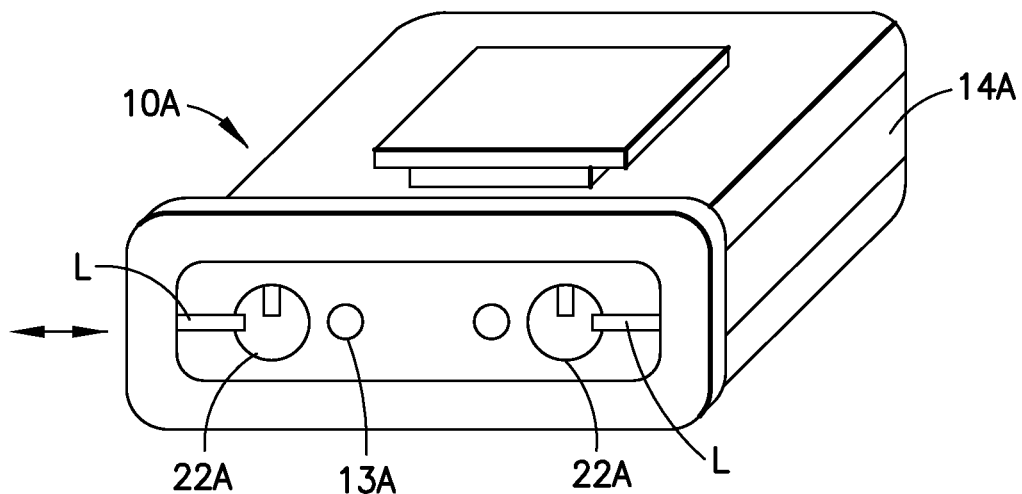
FIG. 2A is a schematic perspective view of the substrate transport apparatus in FIG. 1A.
Figure 2B:
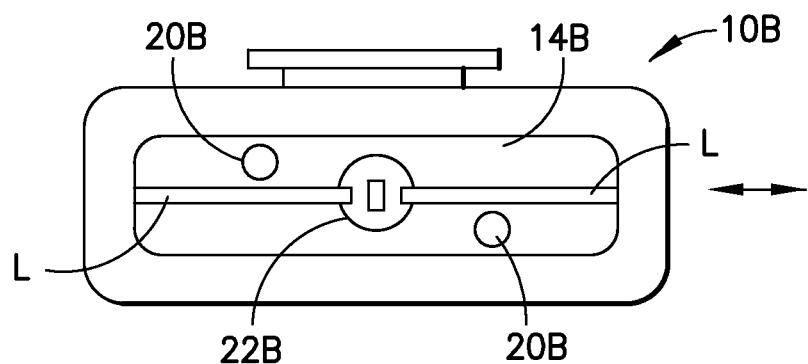
FIG. 2B is an elevation view of the transport apparatus.

In the exemplary embodiment shown in FIG. 1B, the substrate carrier 10 has a casing 11 two slots 12, 14 for the placement of substrates S (see FIG. 1). The substrates S may be any desired substrate such as 200, 300, 450 nm (or any other diameter) semiconductor wafer, or reticle or flat panel for flat panel displays. The carrier casing is capable of holding a controlled atmosphere inside the carrier. The carrier 10 may have a side opening door 13 and features 16 for kinematic docking to the loadport LP that will open the carrier door. In alternate embodiments, other door and docking arrangements may be provided, such as flanges, guides or rollers for example. In other alternate embodiments, the carrier may be bottom opening. In this embodiment, the carrier also has features 20 to be handled using an overhead hoist, similar or alternate material transport device. As seen in FIGS. 2A-2B the door may be locked with a single or dual cam mechanism and may have a hole and slot for pin locating, such as for example, in a similar fashion to current SEMI standard FOUP carriers. FIG. 2A is a schematic perspective view of an exemplary embodiment of carrier 10A (similar to carrier 10, in FIG. 1A) with a door having a dual cam mechanism 22A. The cam mechanism may be any suitable camming mechanism capable of releasably locking the carrier door 14A to the carrier casing. As seen in FIG. 2A, the cam mechanisms are substantially similar to each other. In this exemplary embodiment, each cam mechanism actuates a lock member L laterally. This allows the height of the carrier to be minimized. In alternate embodiments the lock members may be actuated in any desired direction relative to the reference frame of the carrier. The door 13A of the carrier has openings to enable keys LP (see FIG. 1B) on the loadport (not shown) to engage and actuate the cam mechanism. FIG. 2B illustrates another exemplary embodiment of carrier 10B (otherwise similar to carrier 10) with a single camming mechanism 22B. The single cam mechanism 22B includes two lock members rotated substantially simultaneously in opposing directions (e.g. laterally) to lock and unlock the door 14B. Apertures 20B for locating pins in the door, in this embodiment, are located as desired to avoid interference with the camming mechanism.

Figure 2C:
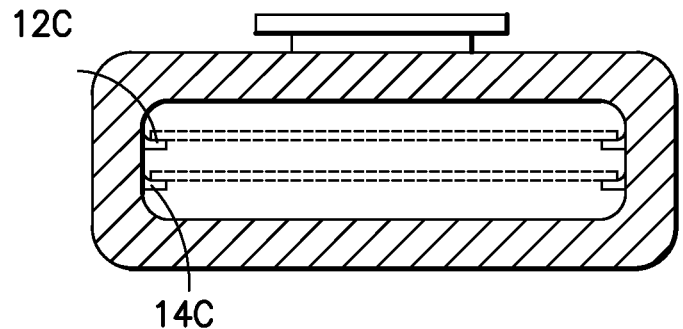
FIG. 2C is a cross-sectional elevation of the transport apparatus.

Referring again to FIG. 1A, in this embodiment the carrier 10 is loaded so that one slot 12, 14 may be filled with substrates during carrier transport. Upon docking to load port LP of tool CT carrier 10 may have one substrate slot 14 filled and one empty. Any one of the two slots 12, 14 of the carrier may be filled (and FIG. 1A shows slot 14 filled merely for example purposes). The two slots 12, 14 allow the carrier to act as a buffer which can be utilized for a fast swap at the process tool. In the case, of conventional reduced capacity carriers where there is only one slot the robot in the process tool must have the capability to quickly swap the wafer in the carrier so the carrier may be able to be replaced with another carrier that has an unprocessed wafer to keep the tool busy. Many process tools do not have such capability, as in the case where there is a conventional robot with only one blade/end effector. In such a case, the robot picks the unprocessed wafer from the carrier, places it within the process tool, picks a processed wafer from within the tool and then places the processed wafer in the carrier. In contrast, carrier 10 in this embodiment has two slots 12, 14, so that single blade robot R may place a processed wafer S2 in the unused slot 12, pick the unprocessed wafer S from the other slot 14 and proceed much quicker. Further, in the exemplary embodiment shown, the processed wafer 52 may remain in slot 12 (previously a buffer slot now becomes a wafer holding slot) for subsequent transport in carrier 10 to the next processing tool PT2 in the processing protocol (indicated by arrow M in FIG. 1B). This further expedites throughput of the processing tool PT as well as that of the FAB. As may be realized, placement of the processed substrate S, S2 in the slots 12, 14 of carrier 10 is independent of the slot position in the carrier 10. By way of example, if a given preprocessed substrate S, S2 is located in bottom slot 14 of carrier 10 on arrival at tool PT, that same substrate S, S2 may be placed post processing in either slot 12, 14 of carrier 10 for transport to the next tool. As has been noted before, in order to increase processing tool and FAB throughput, the processed substrate S2 may be returned to a different carrier 10 than the carrier that initially brought the substrate to tool PT for processing. For example, the initial carrier (indicated in FIG. 1B as carrier 10') bringing the unprocessed substrate to tool PT, may not remain at tool PT to await substrate processing and may be transported (in a loaded or unloaded) in the process direction M to another tool PT2 during substrate processing. Another carrier 10, that (for maximum throughput) may be loaded with another unprocessed wafer S, may be docked to the tool PT coincident with completion of processing of the earlier loaded substrate S2. Accordingly, the processed substrate S2 may be placed in carrier 10, rather than original carrier 10', the buffer slot 12 allowing both placement of the processed substrate S2 in the loaded carrier 10, as well as facilitating the fast swap of substrates to quickly load the processed substrate S2 and unload the unprocessed substrate S from the carrier. The processed substrate S2 may now remain in what had been the buffer slot 12, which as noted before becomes the substrate holding slot and the prior substrate holding slot 14 now empty may become buffer slot, even if the buffer slot 12 has a different slot position (top slot) within the carrier 10 than the slot (bottom) in which the substrate when unprocessed was brought to the tool. Thus, a substrate that comes to the tool in a bottom slot of a carrier may leave in a top slot of a carrier and vice versa. This allows the carrier 10 to be closed immediately after the fast swap and be ready to be moved to the next tool PT2 in the FAB without further repositioning of the loaded substrates in the carrier. The controller registers that given carrier 10 holds the given loaded substrate S2 without relating a specific slot location to a specific substrate. Tracking of the specific substrates S, S2 in controller CONT may be by associated carrier rather by associated substrate slots in the associated carrier despite the presence of multiple substrate slots in the given carrier. As may be realized one wafer slot 12, 14 of the carrier may be a discretionary wafer slot in that it may be optionally empty or filled when conventional carriers including carriers with 1, 13, and 25 slots. The two slot carrier may be used to transport a single wafer only. The additional or discretionary slot maybe used to allow for fast swaps at the carrier. This and the independent placement of wafer in slots will allow for a further reduction in cycle time and reduce loadport overhead. The two slot carrier 10 should allow for a fewer number of carriers in the FAB because they can essentially be in constant motion with the exception of the faster wafer swap time. In alternate embodiments the carrier 10 could be used to transport two substrates. The wafer supports 12, 14 that comprise each slot may be shaped to support the wafer by the edge or and within an edge exclusion zone (see FIG. 2C).

Figure 2D:
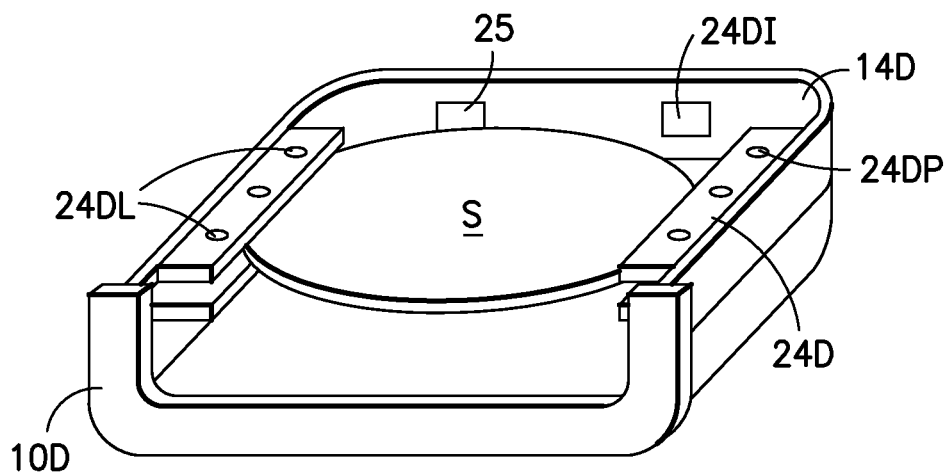
FIG. 2D is a cut away perspective view of the transport apparatus.
Figure 2E:
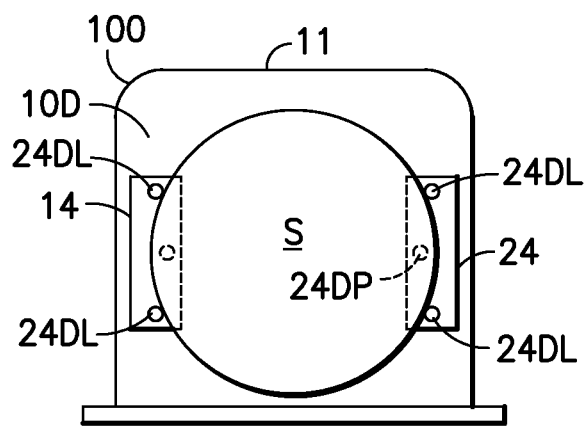
FIG. 2E is a plan view of the transport apparatus.
Figure 3A:
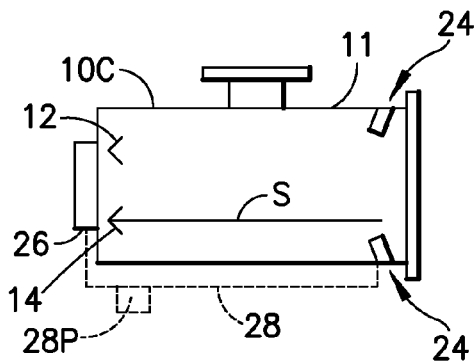
FIG. 3A is a schematic elevation view of a substrate transport apparatus in accordance with another exemplary embodiment.

Referring to FIG. 3A, there is shown a carrier 10C having a sensor suite in accordance with another exemplary embodiment. Carrier 10C may include integral or embedded sensors to determine wafer presence and wafer position. These sensors can be read when the carrier 10 is docked on a load port LP. In the exemplary embodiment shown in FIG. 3A, carrier 10C (similar to carrier 10, 10A) may be provided with embedded or integrated sensors 24, for example, to allow for substrate position and presence detection. Referring also to FIG. 2D, that illustrates a representative cross-sectional view of the transport carrier 10D (transport carrier 10D is similar to containers 10, 10A, 10B, 10C described before), the sensors 24 maybe mounted interior to the carrier casing and are capable of sensing the presence of substrates inside the container. In the embodiment shown in FIGS. 2D-2E, the sensors 24D may be positioned on the supports or structure forming the substrate slots 12, 14. In alternate embodiments, the sensors 24 may be placed on any other portion of the container allowing the sensors to sense the substrates on slots 12, 14. As shown in FIG. 2D, each of the slots (only slot 14D is shown in FIG. 2D for example purposes) has sensors 24D for detecting the characteristics of the wafer on the slot. In alternate embodiments, the sensors of one slot may be positioned or otherwise configured to be able to sense substrates in any one of the slots 12, 14 of the container. The sensors may be of any suitable type such as an electro-optical (e.g. light source and detector (photo cell or CCD) or capacitive sensor capable of sensing a presence of the substrate. The sensors 24 may comprise a number of discrete sensors such as a wafer presence sensor 24DP and wafer location sensors 24DL. As may be seen in FIG. 2D, the wafer location sensors 24DL may be e located to enable wafer centering. A wafer ID reader 24DI, such as a raster scan laser or CCD is positioned to read ID information encoded on the wafer in each slot. In alternate embodiments, the wafer ID reader may be a suitable RF interrogation unit capable of interrogating a RFIC on the wafer programs with wafer ID information. The sensors 24 may be capable of sensing orientation of the wafers in the slots, for example by sensing a fuducial on the wafer. For instance, sensor 24DI reading the ID code may be able to sense position of the code relative to a predetermined reference and thereby identify orientation of the wafer (in this case the ID code would be on the periphery of wafer). The sensors 24 are connected by suitable communication links 28 to power supply and control package 26 (see FIG. 3A). The power supply and control package 26 may be integral to the carrier casing 11, providing continuing power and communication with the sensors during transport as well as when docked on a load port. The control/power package 26 may also be removable, with a suitable coupling (e.g. "plug and play" coupling) provided in communication link 28 and to the container casing to facilitate ease of removal and installation of the package 26 as a module. Communication link 28 also may include a suitable port or link 28P (such as for example a wireless link) allowing the sensors 24 to be communicably coupled to power and control system of the load port LP (see FIG. 1A) when the container 10 is docked with the load port. Thus, the embedded sensors 24 may be capable of identifying wafers in addition to their slot location and orientation and location at any desired time, either during transport or when the container is docked to the load port. Additionally, the embedded sensors may be capable of identifying location within the tool or factory, such as by RF (suitable electronics such as an RFIC 25 may be included in sensors 24) or barcode (not shown). A processor, memory and communication (not shown) may be provided (either within package 26 or mounted otherwise to the container casing) to communicate with tools PT, PT2, host controller CONT, transport controller CONT or other suitable interface such that carrier and wafer specific information may be freely shared to eliminate communication that, in a serial fashion, presently affects the throughput of the fab or the tools within the fab. As an example, the sensor and communication function provided by carrier 10C can eliminate the mapper on the robot, or the load port, and a wafer slideout sensor on the loadport and may provide lot and recipe information through the host controller CONT or directly to the tool. Further, the memory and communication function may enable other wafer specific information, such as wafer orientation to "travel" with the wafer. For example, once a predetermined orientation has been established for a given wafer S, S2, such as by using an aligner, the orientation information may be stored in the container memory of the container 10C holding the given wafer and read as desired at a subsequent load port. This will result in a further through put improvement by eliminating the safe wafer mapping and communication step used in conventional systems.

Figure 4A:
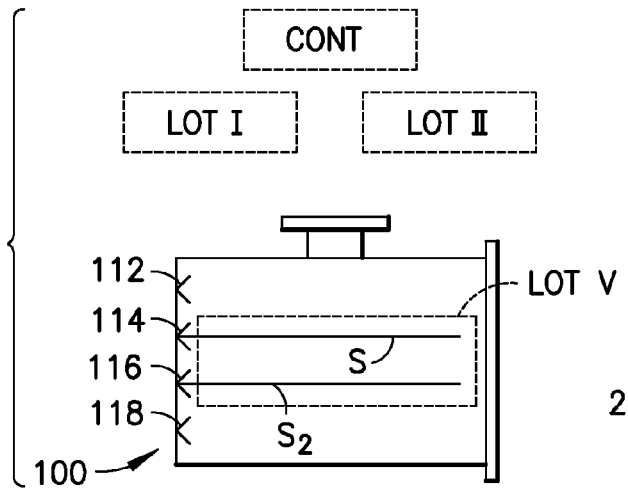
FIGS. 4A-4B are respectively schematic elevation views of different sides of a substrate transport apparatus in accordance with still another exemplary embodiment.
Figure 4C:
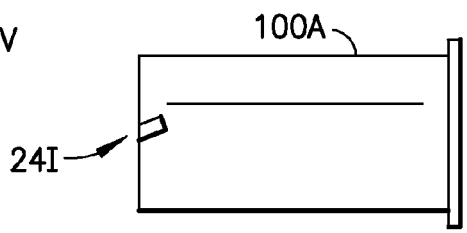
FIG. 4C is a schematic elevation view of a substrate transport apparatus in accordance with another exemplary embodiment.
Figure 4B:
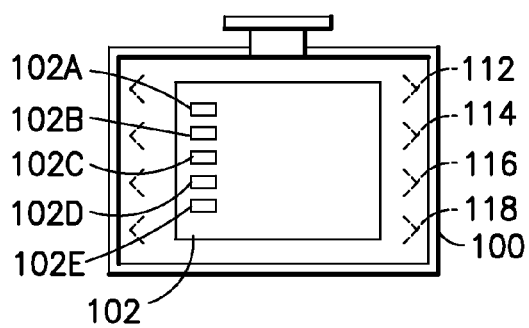

Referring now to FIGS. 4A-4B, there is shown another exemplary embodiment of a substrate carrier 100 that has one or more slots 112, 114, 116, 118 for the placement of substrates, plus additional or discretionary slots 112, 114, 116, 118 for further buffering. In the embodiment shown, a total of four slots 112, 114, 116, 118 are provided, in alternate embodiments, more or less slots could be provided. The carrier 100 is shown in FIG. 4A with substrates S in two slots for example purposes, and substrates may be loaded in more or fewer slots as desired. Conversely, more or fewer buffer or discretionary slots may be provided amongst the total slots in the carrier. The carrier 100 may be substantially similar to carrier 10, except as otherwise noted, and may have a side opening door and features for kinematic docking to a loadport (similar to load port LP in FIG. 1A) that will open the carrier door. In alternate embodiments, other door and docking arrangements may be provided, such as flanges, guides or rollers for example. In other alternate embodiments the opening in the carrier casing may be in the bottom of the casing. The carrier also has features to be handled using an overhead hoist, similar or alternate material transport device. The door may be locked with a single or dual cam mechanism and may have a hole and slot for pin locating, such as for example, in a similar fashion to SEMI standard FOUP carriers. Similar to carrier 10 described before, placement of the substrates S in the slots 112, 114, 116, 118 of carrier 100 may be independent of relative position of the slots in carrier. For example, the top slot 112 may be reserved to allow the carrier 100 to act as a buffer at the tool (similar to carrier 10 at tool LP shown in FIG. 1A) which can be utilized for a fast swap at the process tool as described before. The remaining slots may be discretionary slots which may be flexibly utilized by the tool or the factory. One example is where the fab is ramping production. In this case, the "pipeline" for a given tool(s) is not filled. Therefor if only single conventional wafer carriers are used, to fill the pipeline, multiple carrier transports are desired to funnel unprocessed wafers into the fab to fill the process tool pipeline. However, the discretionary slot(s) of carriers 100 (or carrier 10) may be filled with unprocessed wafers during ramp up to reduce bottlenecks and material transport handling steps during production ramp VP. The discretionary slots of the carrier 100 may not be loaded during steady state production. A second example is where the fab has a temporary latency or bottleneck. In this case, if only single conventional wafer carriers are used, the latency or bottleneck stops a given tools production, or otherwise would demand carriers be buffered until the bottleneck is resolved. However, the discretionary slot(s) of carrier 100 (or carrier 10) may be filled with processed wafers while waiting for resolution or material transport availability. Although these are two examples, it may be realized that by providing carrier 100 (and carrier 10 in FIGS. 1A-1B) with the substrate holding slots as well as discretionary slots enables general use by the tools and factory of the additional storage and buffering capacity (as defined by the discretionary slots) of the carrier where it optimally is used during steady state with fewer or a single wafer and with additional processed or unprocessed or test wafers where the production condition or equipment states would be able to flexibly maintain flow. Alternately, the carrier could be used to transport four substrates. The multiple slot design in combination with flexible dispatching of wafers allows for an optimal number of carriers and optimal transport of wafers through the factory.

It is further contemplated to use the multi-wafer carrier as a "virtual" lot size transfer container. The term virtual lot refers to the condition that the substrates (e.g. S, SL as shown in FIG. 4A) loaded into the carrier 100 at a given tool (similar to tool PT in FIG. 1A) may not correspond or represent a pre-existing substrate production lot. Rather, it is the placement of the substrates S, S2 into the carrier that defines or effects the formation of the virtual lot (lot V) formed by substrates S, S2, which is a lot that may not have existed prior to substrate loading into the carrier. For example, substrates S, S2 may each correspond to different production lots (graphically represented in FIG. 4A as lots I, II). Each lot I, II may have unique or corresponding fabrication protocol (i.e. recipe, timing) associated therewith. The fabrication protocol associated with each production lot I, II (which may be referred to herein as actual lots in contrast to virtual lots) as well as the substrates S, S2 in the different actual lots I, II is registered in the controller CONT. Actual lots I, II may have one or more substrates corresponding thereto. The substrates in each actual lot I, II may proceed through the FAB in accordance with the fabrication protocol of the lot, which for example purposes results in substrates S, S2 being at the same processing tool (similar to tool PT in FIG. 1A) processed and ready to be off loaded from the tool at substantially the same time. A supervisory software system in the controller CONT looks at the state of the process tools, including the tools where the substrates S, S2 currently are, and the tools (similar to tool PT2 in FIG. 1B) where the substrates S, S2 may go in the respective processing cycle (corresponding to the actual lots I, II) as well as the carrier transport system to manage the wafer transport (using the carriers simply as transport devices) to increase FAB manufacturing efficiency (e.g. optimizing the throughput, or reducing the inventory of an operating facility). In this example, substrates S, S2 may both be transported to the same following tool in the fabrication protocol. For example, if the subsequent tool (e.g. similar to tool PT2 in FIG. 1B) is available to process the substrates S, S2 contained, the substrates S, S2 may be loaded both on carrier 100 and the carrier may be transferred to the subsequent tool before waiting for additional wafers from the actual lots I, II to be processed on the current tool. Thus substrates S, S2 from different actual lots lot I, II may be combined in a carrier to form a virtual lot V. The virtual lot established may be transient, or may remain for transports to a number of tools in the FAB. As may be realized the ability to independently place the substrates in the slots 112, 114, 116, 118 of the carrier 100 along with the availability of discretionary slots enables the container to establish the virtual substrate lots. The lot size transported would vary with the optimal demands of the manufacturing flow.

Figure 4D:
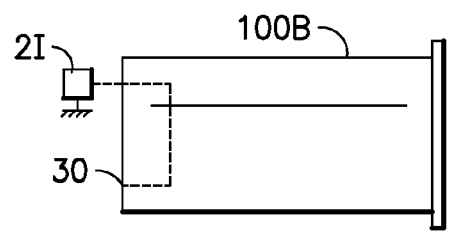
FIG. 4D is a schematic elevation view of a substrate transport apparatus in accordance with another exemplary embodiment.

Further features may be provided to the carrier in accordance with the exemplary embodiments illustrated in FIGS. 4C-4D. One such feature is the ability to identify the carrier and/or wafers therein without opening the carrier/container. Similar to carrier 10, features may be provided to accomplish a wafer or carrier id with a side read, top or angled read where the identification is readable independent of wafer orientation or carrier orientation, such as in the case where rf tags are used or a repeating bar code pattern on the side of the wafer is used. As an example, bar code or other optical id may be provided on the wafers and viewed by an external reader 21 through a port 30 formed in the casing of carrier 100B (not shown) (see FIG. 4D). Alternately, radio frequency tags (not shown) may be provided in combination with stationary RF readers (located similarly to external reader 21 in FIG. 4D) that simultaneously or serially read or interrogate the tags on the wafers in the carrier when the carrier is in range of the remote readers. Similarly the carrier may have identification indicia or a RFIG (similar to tag 25 in FIG. 2D) with identification indicia capable of being read by remote reader 21 to identify carriers and location in the FAB. In other exemplary embodiments, the reader 241 (see FIG. 4C) may be resident on the carrier 100A, wafers to identify combinations of wafers in the carriers. These features may be provided in combination to eliminate, if desired, conventional carrier-tool handshakes, such as SEMI E84 handshakes. In this manner, reading and identification, before or at the tool docking, with handshake may occur direct to the material control system, factory host, tool controller or otherwise, for example at the factory side with read in addition to both wafer and carrier information (recipe, destination, location, lot, id . . . ) tracked at the fab level. These features may further be combined with mapping within or through the pod where features are provided on the pod to allow an optical path.

Referring again to FIG. 4B, in this exemplary embodiment the carrier 100 may have an indication panel or device 102 for indicating to an operator various operating status and or health conditions associated with the carrier. The indication device 102 is illustrated representatively in FIG. 4B and may be of any suitable type. For example the indication device may be indicator lights connected to a suitable logic circuit to switch on/off, according to respective conditions, and thereby become illuminated to indicate the corresponding condition. In alternate embodiments, the indication device on the carrier may be a graphic display, such as an LCD display, operated by a suitable controller programmed to generate desired indicia on the display corresponding to conditions of the carrier. Examples of conditions that may be indicated by the indicia 102A-102E in the indication panel may be proper/improper interface of carrier to load port, carrier door open/closed, interior carrier environment condition (for example in the case a door seal has failed or is not properly seated), substrate shelf load/unload condition, substrate aligned/not aligned condition and in the case for independently powered carriers a battery status condition. The aforementioned are merely examples and in alternate embodiments more, fewer or any other desired conditions may be indicated by the indication device.

Figure 7:
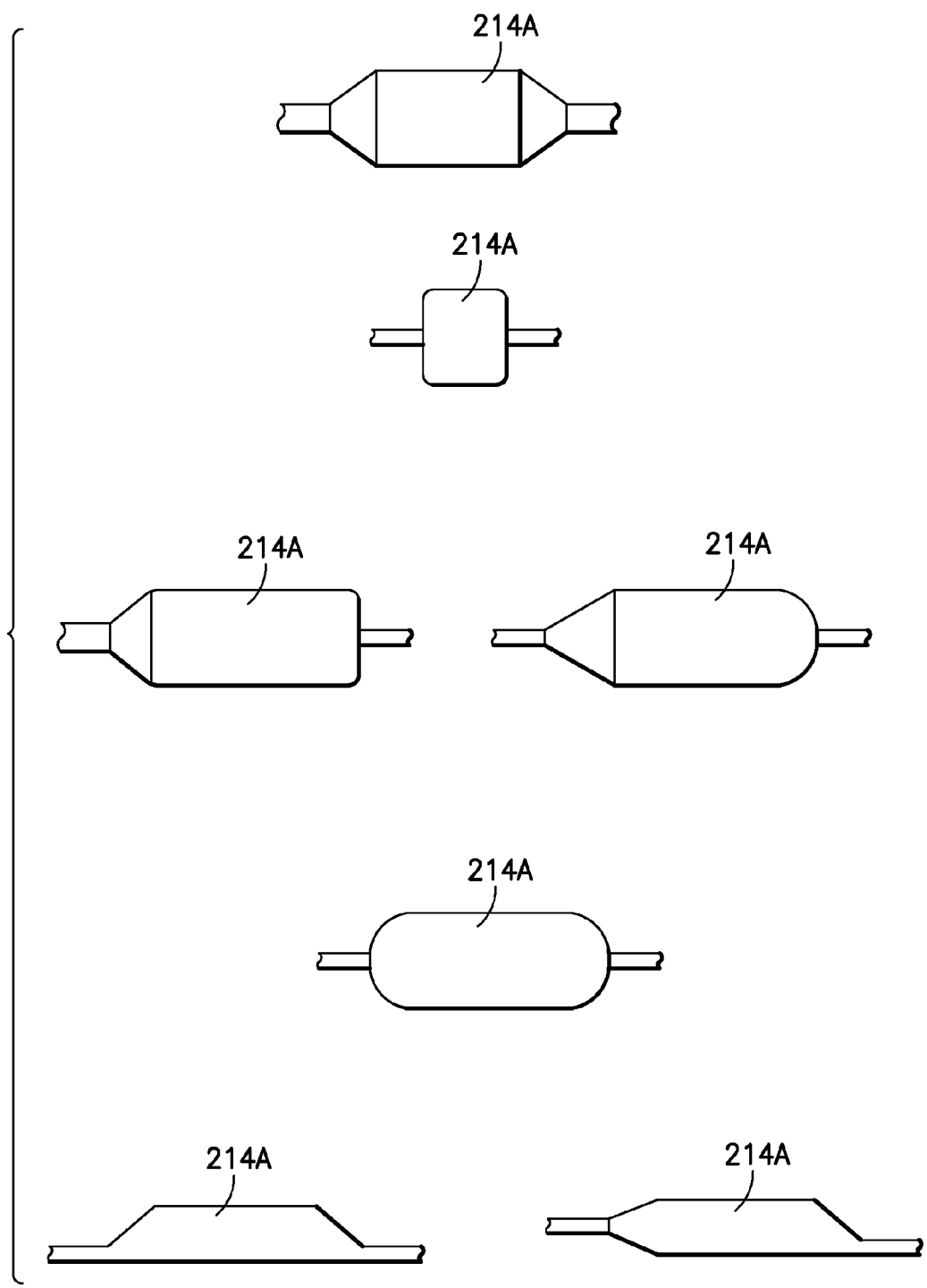
FIG. 7 is an elevation view of different closures for the opening shown in FIGS. 5-5A.

The pod may be provided in alternate embodiments in a top or bottoming opening configuration or as a further example, a clamshell type opening. In alternate embodiments, other opening configurations could be provided. Such an example is illustrated in FIGS. 5-5A and 6-6A, where the carrier 210 could include a balloon or bellows type door where no additional motion is employed for opening and closing the door other than inflation, deflation, or evacuation for example. FIGS. 5-5A and 6-6A are respective elevation views, and corresponding cross section views, of carrier 210 with an active door 214 (for opening and closing a substrate transport opening in the container casing) shown in respective closed and open positions. The container 210 is substantially similar to containers 10, 100 described before and has similar features except as noted otherwise. Door 214 is an active door in that the door configuration itself may be changed in order to effect opening and closing. In this embodiment the door 214 is fluid (gas/air) actuated but in alternate embodiments the active door may be actuated by any suitable mechanical or electrical means. Door 214 in this case is shown as having two substantially similar but opposite portions 214A, 214B. In alternate embodiments the door may have but a single actuated portion. In this embodiment, each door portion generally includes a balloon member 215 (see also FIG. 7 which illustrates various conventional balloons that may be used to form door 214). The balloon member 215 has a general offset configuration, though any suitable configuration may be used. The balloon member 215 has neck portions that provide connections for supplying and drawing fluid from the balloon member thereby to respectively inflate and deflate the balloon. The balloon member is inflated to close the door (as shown in FIG. 5A) and deflated to open the door 214 (see FIG. 6A). The opening in the container casing may have any suitable shape to form a seal around the outer surface of the door balloon members when the door 214 is closed. The container 210 may include suitable fluid lines to allow fluid communication between the balloon members 215 and a fluid supply and fluid drain 202V. The fluid supply/drain 202V may be integral to the container 210 such as a reversible solenoid pump. The responsible pump may be actuated by a suitable signal when the container 210 is docked to operate to evacuate the balloon members 215 and open the door 214. Prior to undocking of the container the pump is reversed to inflate balloon members 215 and close the door 214. Otherwise, the operable fluid source 202V of the doors may be located in the load port or FAB facility, the container 210 being provided with a suitable interface (e.g. a quick disconnect coupling 240/242) to mate to the source upon docking to the load port. The interface may include charge and discharge portions conforming to the operable fluid source 202V of the load port for example.

In other exemplary embodiments, described below the door of the carrier may be removable, combination vacuum latching and holding may be provided, such as where the latch is an expandable seal in a groove (somewhat similar to balloon member 215 in FIG. 5 but with balloons (fastened to intermediate door member) to keep the door on the pod where the seal is compressed to release the door with the same vacuum that holds the door for removal. In this manner a simultaneous grip and unlock/lock feature may be provided.

Figure 8A:
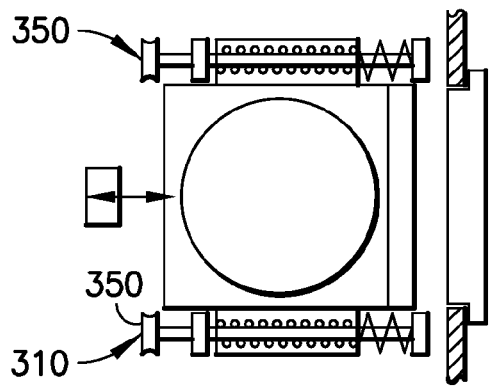
FIGS. 8A-8B are respectively schematic plan and elevation views of a substrate transport apparatus in accordance with yet another exemplary embodiment.
Figure 8B:
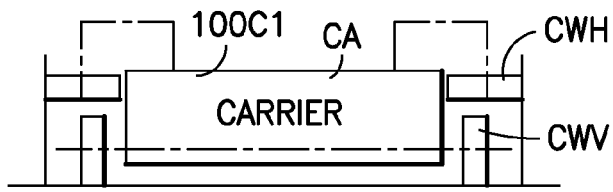

FIGS. 8A-8B illustrate another carrier 310 in accordance with another exemplary embodiment in which active transport features 350 may be provided on the carrier such as a vehicle drive, controls and communication capability such that carriers may be automatically dispatched without handoff to other vehicles within the fab. For example, passive transport features such side rails, top rails, rollers, reduced or eliminated sealing flanges or other features allowing handoff without two motions may be provided. Balls or casters rather than rollers or wheels may be provided to support and transport the carrier for omni directional mobility.

Figure 8C:
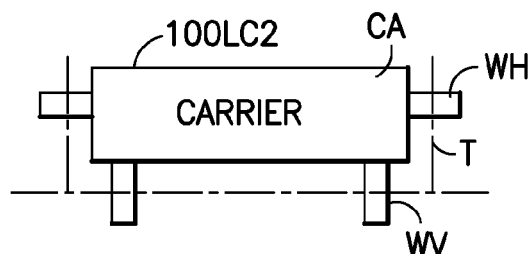
FIGS. 8C-8G are other schematic elevation vies each respectively showing a substrate transport apparatus in accordance with still other exemplary embodiments.
Figure 8D:
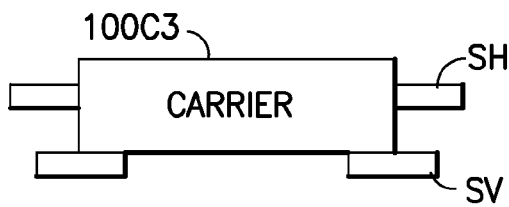
Figure 8E:
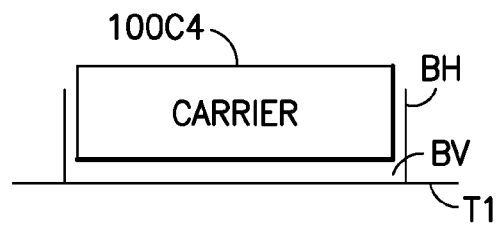
Figure 8F:
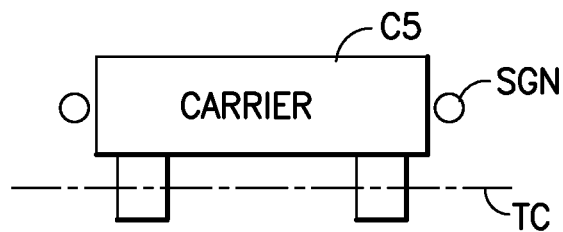
Figure 8G:
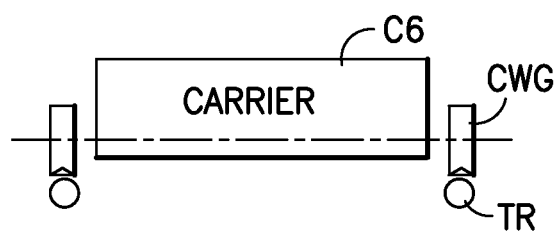

FIG. 8B illustrates a carrier 100 C1 in accordance with an embodiment where the carrier frame CA has wheels CWV and CWH mounted thereon for providing both vertical and lateral support. In FIG. 8B, an exemplary embodiment of the carrier 100 C2 is seated against wheels WV, WH (possibly mounted on a supporting track T depending from the tool station or other structure. In the exemplary embodiment illustrated in FIG. 8C, skid plates SV, SH (mounted either to the carrier frame CA or the supporting structure on which the carrier is supported) movably support the carrier 100 C3. In the exemplary embodiment shown in FIG. 8E, the supporting track T1 and/or the carrier frame includes air bearings or mag bearings BV, BH for supporting and guiding the carrier 100 C4. In FIG. 8F, the carrier 100 C5 rests on a movable conveyor $T_c$ (belt or roller) and is guided laterally by side guide rails SGR as shown. In FIG. 8B, the carrier 100C6 has grooved wheels CWG mounted thereon riding on support rails TR. Linear motion can be developed by rotary motors driving belts, ropes, lead screws, robotic arm links, or skewed roller mechanisms, or by linear motors, pneumatic actuators, and the like. The linear motion so developed may be coupled to the carrier for example by mechanical interference, friction, magnetic force, or fluid pressure. Stacking features may be provided to allow stacking of carriers not shown). Pushing and towing features may be provided on one or multiple sides of the carrier to allow the carrier to be passive yet be moved by another active element.

Figure 9:
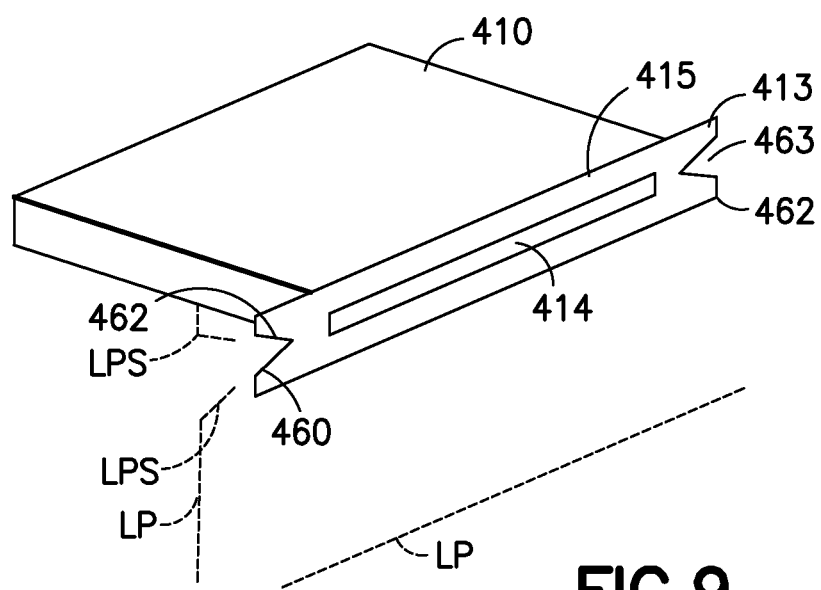
FIG. 9 is a schematic perspective view of a substrate transport apparatus in accordance with another exemplary embodiment.
Figure 10:
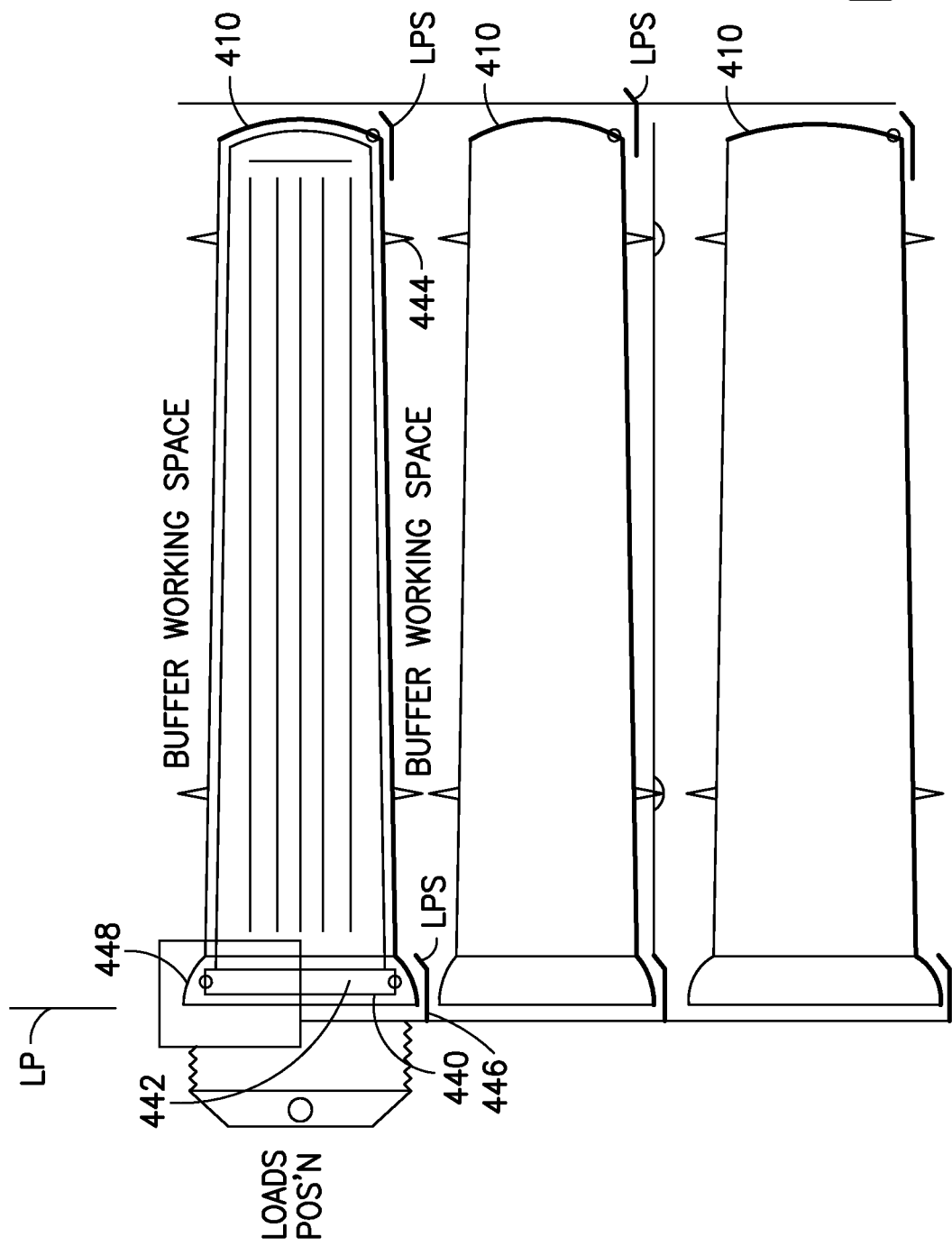
FIG. 10 is a schematic partial elevation view of substrate transport apparatus and a load port interface of a processing apparatus in accordance with another exemplary embodiment.

As seen in FIG. 9, in accordance with yet another exemplary embodiment, docking features 460 may be provided on a docking face 413, such as slotted flanges 915 to further allow precise location and sealing. In the embodiment shown in FIG. 9, the docking features 460 are located, for example purposes only in the side 413 of the carrier having the transport opening. In alternate embodiments, the docking features 413 may be located on any side or surface of the carrier that interfaces in some way with the load port LP. The docking features are kinematic because they are configured to provide self aligning and positioning of the carrier relative to a desired location on the load port or a tool. The features 4B are representatively shown as having a general angled groove configuration, though any suitable configuration, providing the carrier with guide surfaces 462, 463 for accurate positioning during docking with the load port, may be used. In the exemplary embodiment shown in FIG. 9, the docking features 460 complement and cooperate with locating features LPS on the load port to stably guide the carrier into the docked position, such as for example when carrier 410 is moving autonomously into docking position. The door may be side opening, top opening, hinged clamshell or hinged on the side with a slot or linkage to allow opening with minimal particulate generation. Two doors on opposite sides of the carrier may be incorporated to facilitate removal and/or insertion of substrates from either direction. The carrier may be provided on a carriage with wheels (as described before) movable in a first direction and with the carrier spring loaded and movable in a second direction, for example transverse the first direction for docking. Additionally, latching may be accomplished with passive or without moving parts, such as with permanent or electro magnetic latches that are defeated to unlatch the door. Referring now to FIG. 10, there is shown an elevation view of reduced capacity substrate carriers 410 docked to a tool interface, for example the load port LP or a tool similar tool PT in FIG. 1A the carriers 410 in this embodiment are, except as otherwise noted, similar to carriers 10, 100 described before. Carrier 410 is illustrated as having five substrate slots for example purposes, and in alternate embodiments the carrier may have any desired number of substrate slots. The carriers 410 are shown positioned in what may be referred to as a dense pack configuration. In the embodiment illustrated in FIG. 10, the carriers 410 are shown in a vertical stack configuration, though in alternate embodiments the carrier pack may be arranged or stacked in any desired manner. As seen in FIG. 10, the carriers 410 are side (e.g. front) opening. The carriers 410 also use the front face 440 (i.e. the face/side of the carrier in which the substrate opening 442 is located for registration of carrier to the load port LP face without further registration between carrier and load port structure on any other sides/faces of the carrier.

In the case of a front-opening carrier, using the front face for position registration as described in the exemplary embodiment overcomes a deficiency in the conventional 300 mm FIMS (front opening interface mechanical standard) compatible interface, viz, concurrently controlling the horizontal docking interface and the vertical charging interface. This condition in conventional carriers is over constrained and is accommodated by maintaining a gap at the front interface between carrier and load port raising the potential of undesired contamination to the substrates load port and carrier.

Figure 11:
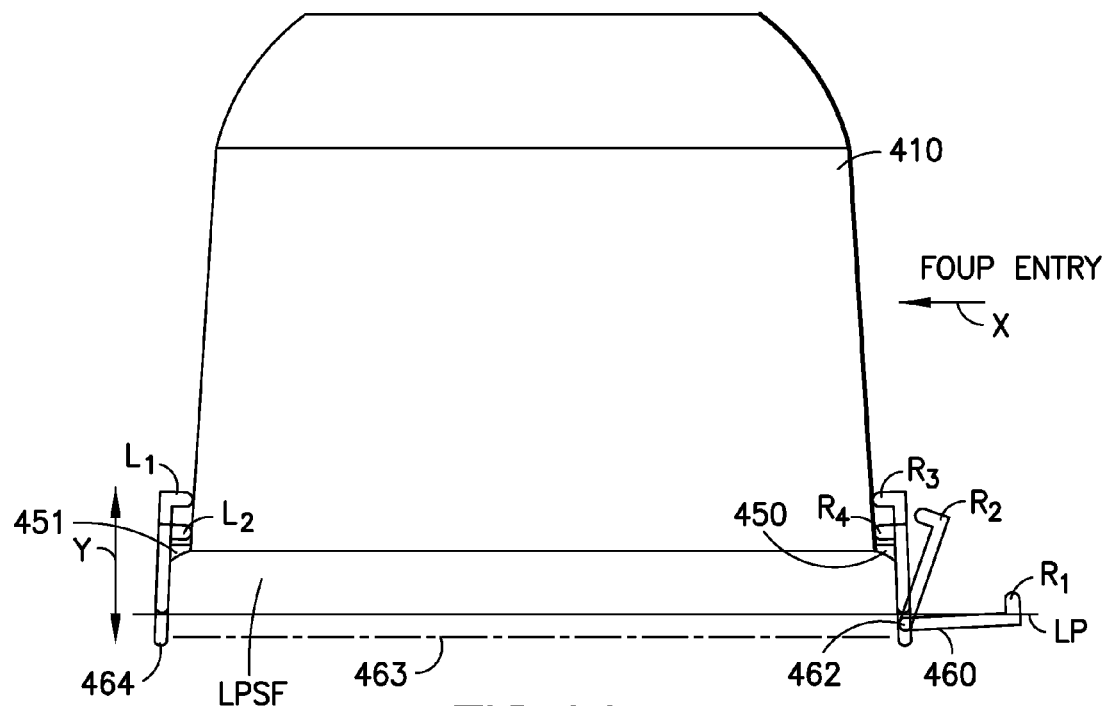
FIG. 11 is a schematic plan view of transport apparatus and load port interface shown in FIG. 10.
Figure 12:
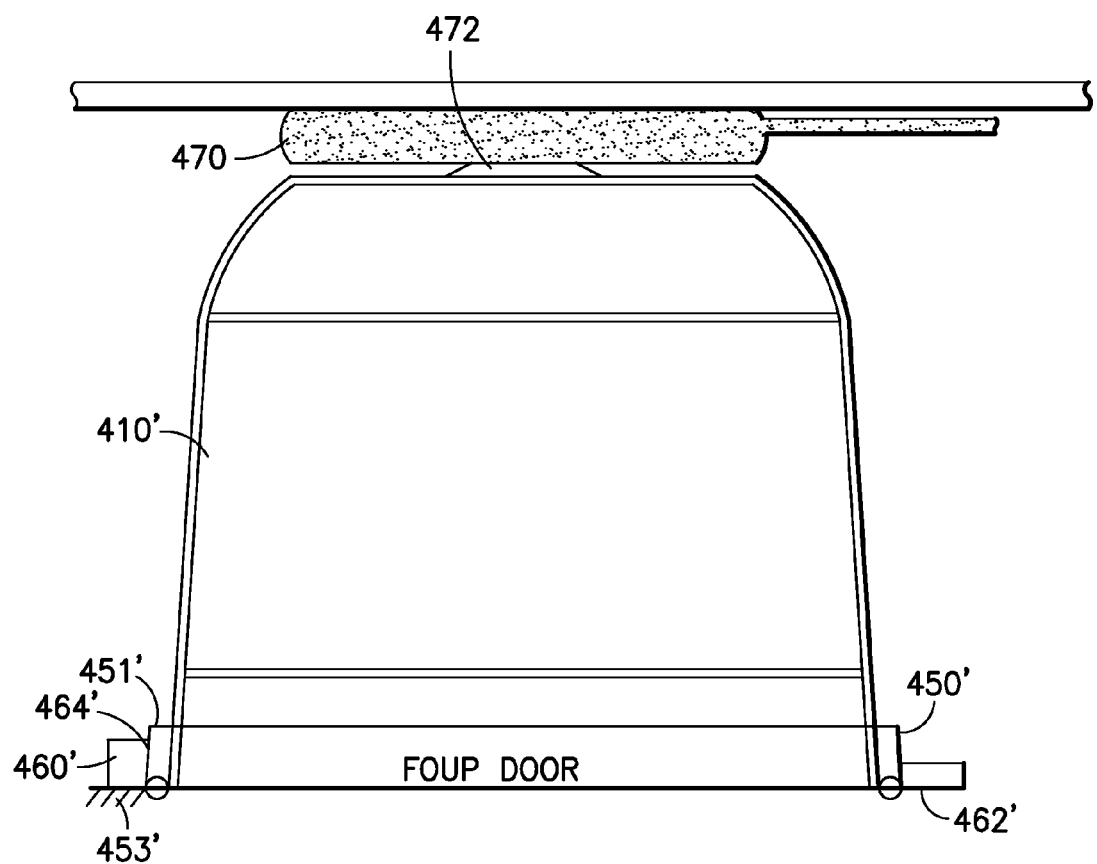
FIG. 12 is a schematic plan view of a substrate transport apparatus, transport apparatus holding station and load port interface in accordance with another exemplary embodiment.

As shown in FIG. 10, such a single-plane interface eliminates the bottom interface and associated shuttle mechanism, allowing the possibility of dense vertical packaging at loadports, or in storage/buffer locations. In the embodiment shown, supports or shelves LPS may be provided to rest the carrier but without registration features. To avoid generating over constraints on registration, the shelves or carrier legs may be arranged so that the carrier when seated freely on the shelf is pitched relative to the registered position. Registration of the carrier as will be described below results in the carrier being lifted off the shelf. Referring also to FIG. 12 there is shown a plan view of carrier 410 interfaced to the load port LP. In this embodiment, the support shelf may define a registration feature for the carrier 410, whereby the bottom of a front carrier structure 446 is registered on a flat surface LPSF. The top 448 is secured by a clamp mechanism 460 which supports the carrier in a cantilevered manner from the load port. In particular, as the clamp 460 is engaged, the rear of the carrier 410 is lifted from its passive support location. The front flat registration surface LPSF may also act as a contamination shield to lower interfaces. The clamp mechanism 460 has opposing clamp sections 462, 464 as shown. The clamp sections are movable respectively between positions R1-R4 (for clamp 460) and position L1-L2 (for clamp 464) as seen clamp part 462 is capable of both rotation and transverse motion and clamp part 464 is capable of only transverse motion in the direction indicated by arrow Y in FIG. 11. Clamp part 462 may be actuated with a four-bar linkage that causes clamp part 462 to engage and pull the carrier flange toward the port. To allow the carrier 410 to be placed by a mechanism from the side in the direction indicated by arrow X the clamp part 462 retracts to the position labeled R1. The two clamping parts 462, 464 may be tied together with a link (shown schematically as, feature 463 in FIG. 11) to enable a single drive axis. As seen in FIG. 11, the carrier 410 has kinematic features 450, 451 that are respectively engaged by the closing clamp parts 462, 464 to draw and hold the seating surface of the carrier face against a mating surface of the load port LP. The clamp mechanisms may be located on the sides of the port opening (as shown in FIG. 11) to minimize the potential of particulate contamination entering the interface area.

Another exemplary embodiment of the registration of a carrier 410' to a load port is shown in FIG. 12. In this embodiment, the carrier 410' is advanced and secured against the port using a compliant rear force. In the exemplary embodiment, an inflating bladder 470 is used to advance the carrier 410' and secure it against the front interface. An adjacent (or same) bladder may have the capability of being evacuated to withdraw the carrier 410' from the port. The bladder 470 has a vacuum cup 472 to secure the carrier 410' while retracting. Any suitable compliant bladder or fluid actuated bellows device may be used. In alternate embodiments any other desired compliant actuation system may be used. This arrangement eliminates the conventional shuttle mechanism (1 axis) and carrier holddown (typically 2 axes) mechanisms of conventional FIMS loadports. As seen in FIG. 12 the front interface in this embodiment includes an adjacent passive registration lead-in. The lead-in is preferably located to the sides of the port to minimize the potential of particulate contamination entering the interface area. The front of the carrier 410' in this embodiment has kinematic facets (seating surfaces) 450', 451' located on the lateral sides of the carrier. The load port has a complementing kinematic interface 460' that is passive with guide and seating surfaces 462', 464' to engage the mating kinematic facets 450', 451' of the carrier thereby guiding and engaging the carrier so that the carrier is held cantilevered from the load port interface similar to carrier 410 in FIG. 10. Suitable seals (e.g. O-rings) 453' in the load port opening perimeter ensure sealing between carrier casing and load port.

Figure 13:
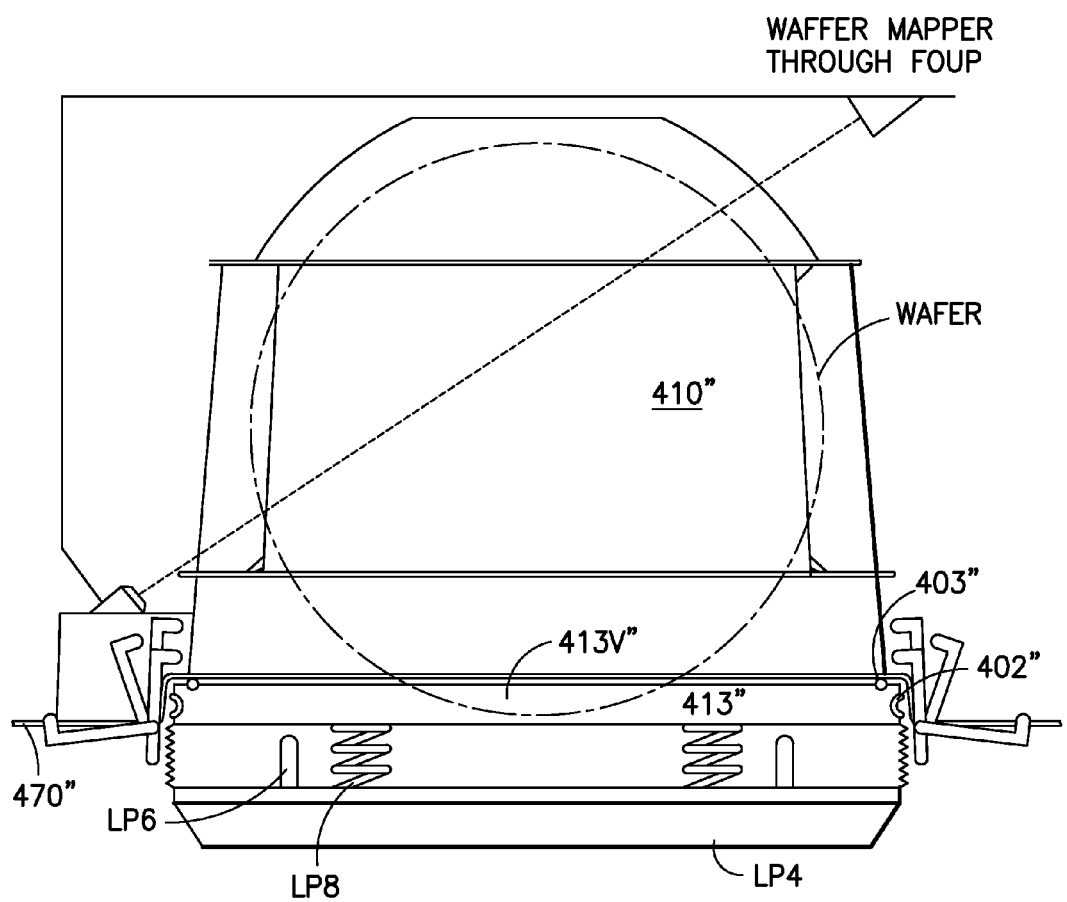
FIG. 13 is a schematic plan view of a substrate transport apparatus, load port interface and substrate mapper in accordance with another exemplary embodiment.

Referring now to FIG. 13, there is shown a plan view of carrier 410" interfaced to the load port in accordance with another exemplary embodiment. In this embodiment a bellows 470" is used to effect the latching and removal of the carrier door. In this embodiment advancement and registration of the carrier 410" to the load port interface may be performed similarly to carrier 410 in FIG. 10-11. As seen in FIG. 13 in this embodiment the carrier door 413" may be held in the frame of the carrier opening by a perimeter deflatable retainer 402" on the door 413" that engages a recess in the carrier frame (not shown) when the door is in the closed position and the retainer is inflated. In alternate embodiments, the door retainer may be any suitable pneumatic actuation members (e.g. pins, balls). In other alternate embodiments, the deflatable retainer of the carrier door may serve also as the seal between the door and carrier casing. In the exemplary embodiment shown the carrier opening frame may have a separate seal 403" to seal the interface between door 413" and carrier casing. As may be realized, registration of the carrier 410" to the load port as previously described results in the bellows 470" being brought into contact with the carrier door as shown in FIG. 13.

Upon contact with the carrier door, the bellows is evacuated (by a suitable system) (not shown) to compress it, thereby securing and retracting the carrier door. Guiding registration pins CPG on the port door LP4 may be used to maintain alignment of the carrier door 413" relative to the port door as it is retracted from, and returned to the carrier. An orifice or opening 413V in the carrier door may allow vacuum to enter the door 413" and deflate the perimeter deflatable retainer of the door. The spring force of the bellows (or separate mechanical springs LP8 located on the port door) may be sized such that the deflatable retainer 408" collapses prior to the door 413" being removed. Upon venting (which may be filtered) of the port bellows 470", the spring force reinserts the door 413" into the carrier, and the collapsible retainer re-engages the carrier flange.

Figure 16A:
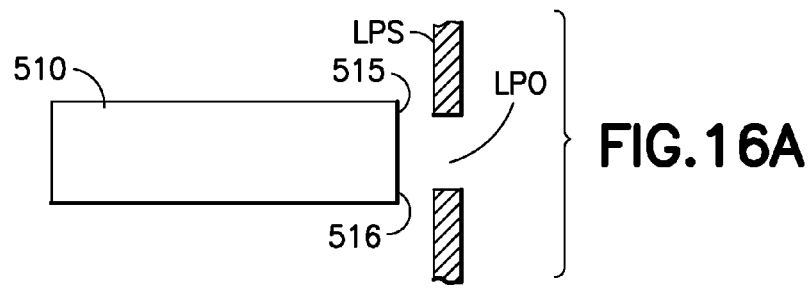
FIGS. 16A-16B are schematic elevation views of the transport apparatus and load port interface opening in FIG. 15 respectively showing the transport apparatus in docked and undocked positions.
Figure 16B:
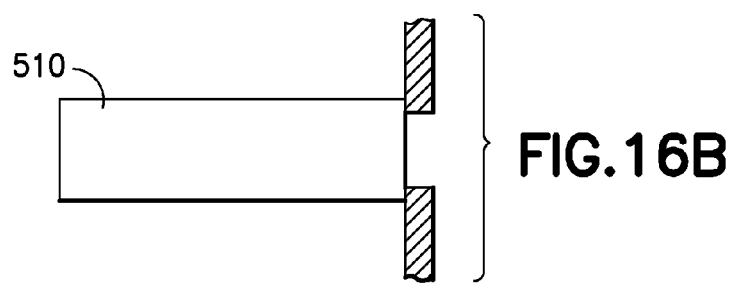

Referring now to FIG. 14 there is shown an elevation view of carriers 510 positioned in buffer locations of a buffer LPB and a load port interface in accordance with yet another exemplary embodiment. Except as otherwise noted, the carriers 510 are similar to carriers 10, 100 described before. The interface to the load port may be similar, except also as otherwise noted to load port LP in FIG. 1A and in FIG. 10. The locations and arrangement of the carriers on the load port LP and buffer LPB is merely exemplary. In this exemplary embodiment, the carriers are each registered and interfaced with the load port LP on the side 515 of the carrier in which the carrier door is located. That side (with respect to which the substrates may be oriented edge on) may be referred to as the front of the carrier. In alternate embodiments, as noted before, the door or carrier closure may be located in the bottom of the carrier (i.e. the side of the carrier facing the bottom of the substrates). Similar to the carrier load port interface shown in FIG. 10, the carriers in this exemplary embodiment may be cantilevered from the support face LPS of the load port. A representative interface between the carrier 510 and load port support face LPS for this exemplary embodiment is shown in FIG. 15. The carrier 510 is shown in FIG. 15 in a position offset from the load port for clarity. In the Figure, the load port support face LPS is shown as being on the load port face or plate that forms the substrate loading opening LPO of the load port. As may be realized, the load port support face may be any surface facing the interface side 515 of the carrier. The interface side of the carrier 515 has kinematic coupling features 516 as will be described below. Referring now also to FIGS. 16A, 16B there is shown schematic elevation views of the carrier load port interface shown in FIG. 15, with the carrier respectively in docked and undocked positions. In the docked position, the kinematic coupling features 516 on the carrier and on the load port support face LPS are engaged to register and hold the carrier in the desired position and alignment relative to the load port opening LPO.

Figure 17A:
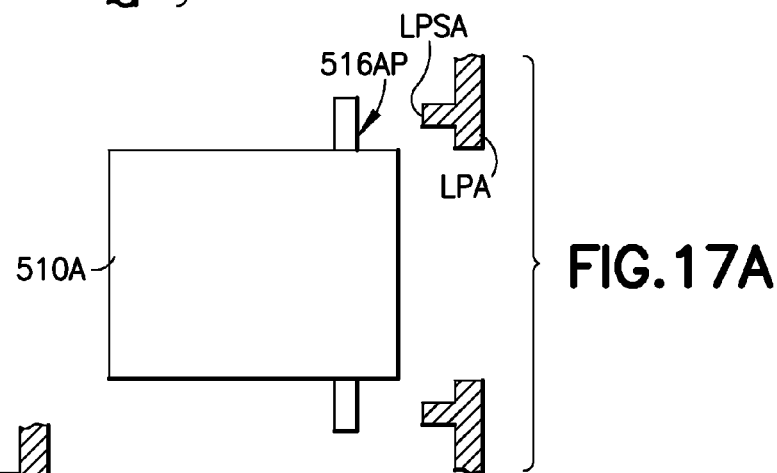
FIGS. 17A-17B are schematic elevation views of the transport apparatus and load port interface opening in docked and undocked position in accordance with another exemplary embodiment.
Figure 17B:
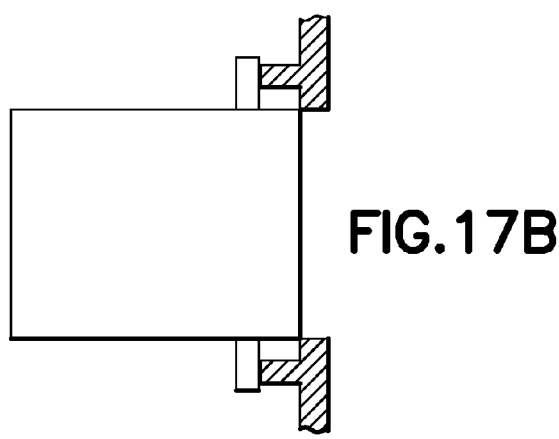
Figure 18A:
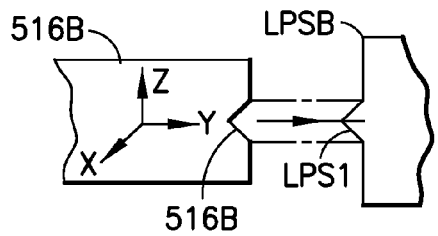
FIGS. 18A-18E are respectively schematic partial elevation views of the substrate transport apparatus interface to the load port in accordance with different exemplary embodiments.
Figure 18B:
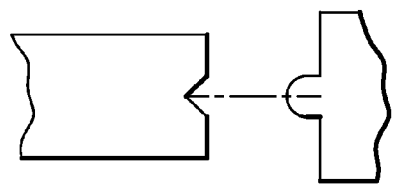
Figure 18C:
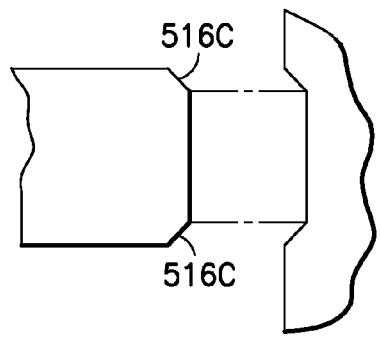
Figure 18D:
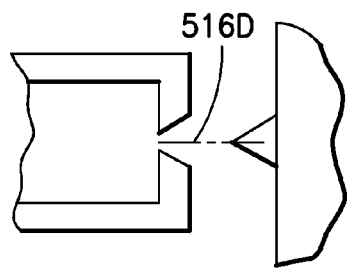
Figure 18E:
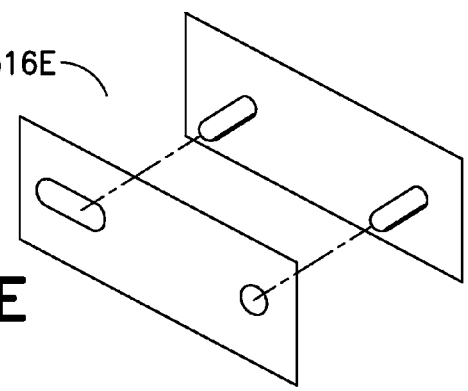

As may be realized, the kinematic coupling features may be of any desired configuration. One exemplary configuration is shown in FIGS. 17A-17B which is a plan view of the carrier 510A in docked and undocked positions relative to the load port. In this embodiment the carrier has laterally projecting surfaces 516 AF (for example on side flanges). The load port has projections that define complementing support faces LPSA. FIGS. 18A-18B show another exemplary configuration of the kinematic coupling. In this embodiment, the carrier 510B may have a tapering guide notch 516B in a face facing the load port support surface LPSB. The load port support surface may have a complementing tapering pad section LPS1 for engaging the notch 516" in the carrier. The projection on the load port may be fixed or may be spring loaded. The taper on the faces of the notch and projection are oriented to guide the carrier to the desired position. In FIG. 18B, the tapering projection on the load port is shaped as a rounded pin. In the exemplary configuration shown in FIG. 18C, the carrier has outer chamfered faces 416C that engage complementing angled faces in the load port. In the exemplary configuration shown in FIG. 18D, the carrier has a tapered bore 516D that is engaged by a complementing projection on the load port similar to projection LPS1 in FIG. 18A. FIG. 18 shows the kinematic coupling 516E which has a male portion with engagement pins and a female portion having a fixing hole (locating the male portion in two directions) and an elongated slot engaging the mating pin to float in one direction.

Figure 19:
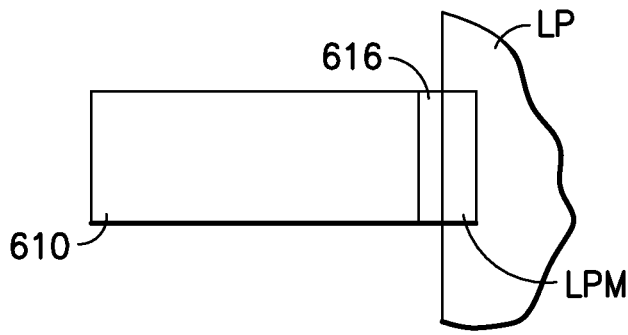
FIGS. 19 and 20A-20C are a schematic elevation view and schematic perspective views respectively showing a substrate transport apparatus in accordance with other different exemplary embodiments.
Figure 20A:
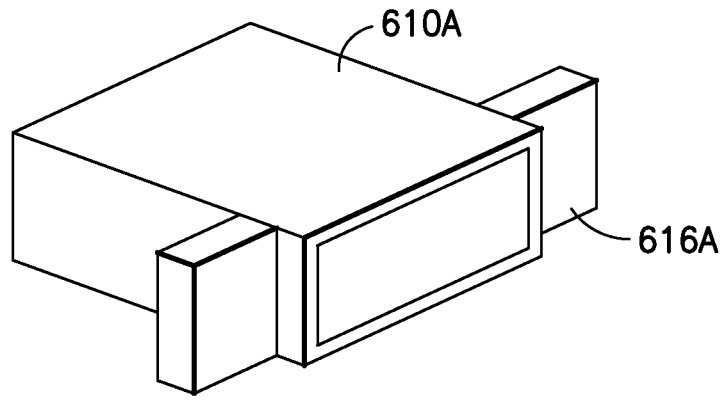
Figure 20B:
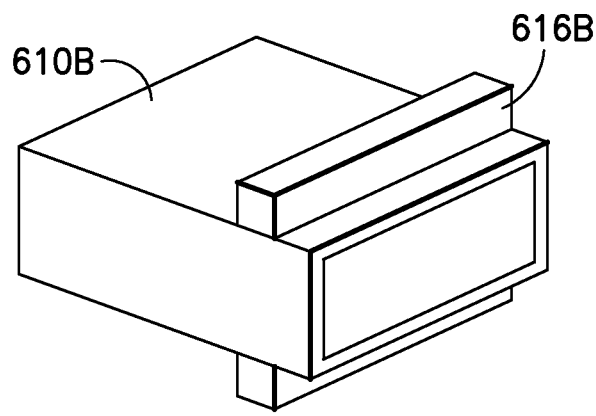
Figure 20C:
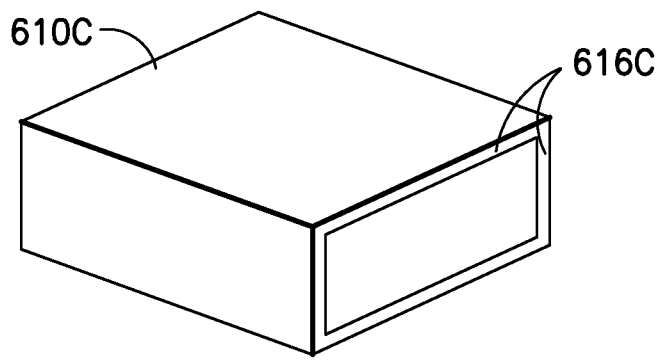
Figure 24:
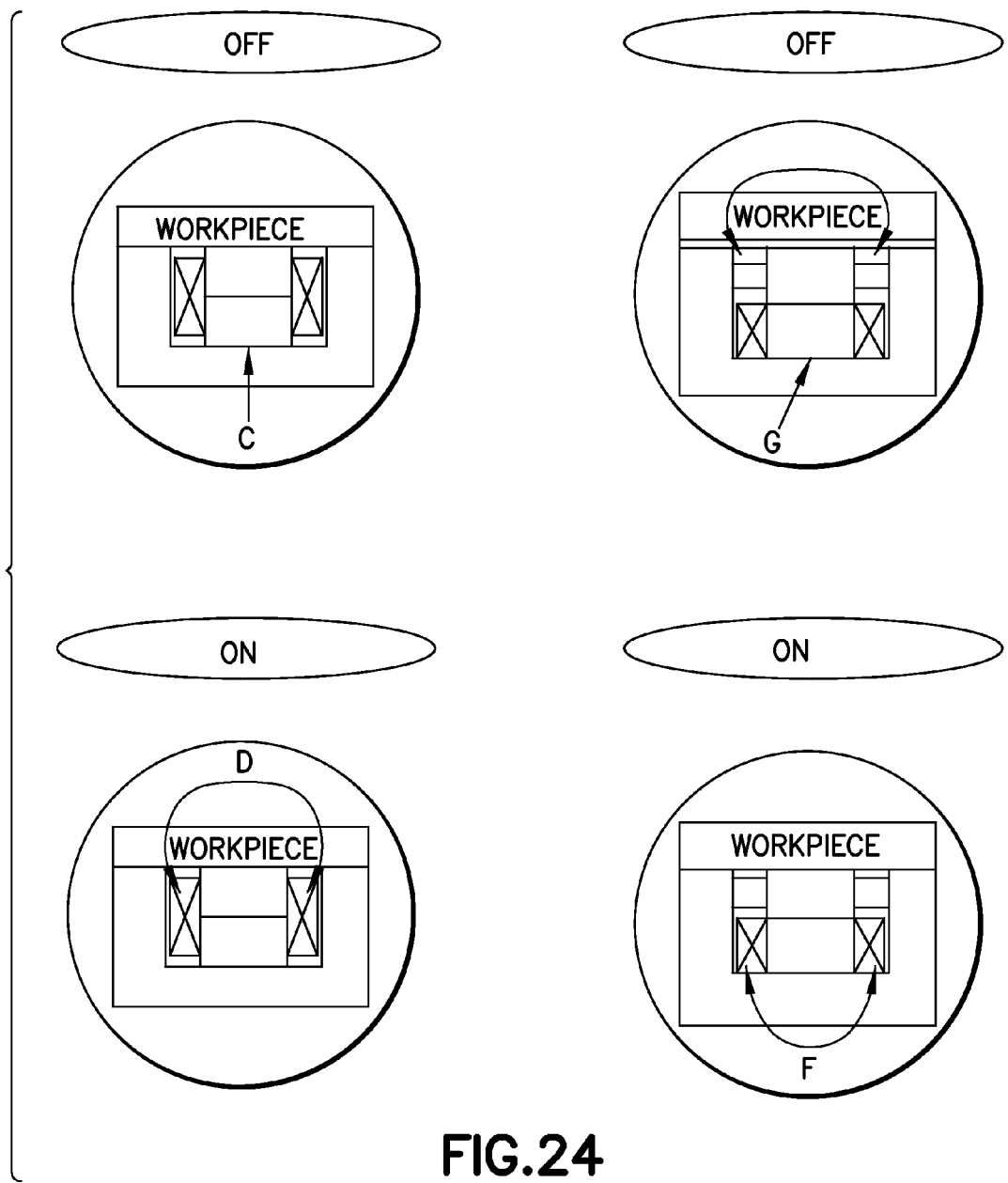
FIG. 24 is a schematic cross-sectional view of a magnetic chock in accordance with the prior art.

Referring now to FIG. 19, there is shown an elevation view of a carrier 610 registered to the load port LP with a electro-magnetic coupling. In this embodiment, the carrier 610 may have suitable magnetic material 616 (such as stainless steel) included in or attached to the carrier casing. The load port be provided with a suitable permanent/electromagnetic chuck LPM. An example of a suitable permanent/electromagnetic chuck is disclosed in FIG. 24, which generally has a permanent magnet or pair of permanent magnets positioned in a coil so that passage of an electric current through the coil switches the chuck on and off. The chuck is activated for carrier retention and deactivated to release the carrier. FIGS. 20A-20C illustrate different exemplary embodiments of the carrier 610A, 610B, 610C with the magnetic material 616A, 616B, 616C in different locations as shown. As may be realized, magnetic retention does not involve moving parts resulting in a very clean interface with substantially no generation of contamination.

Figure 21A:
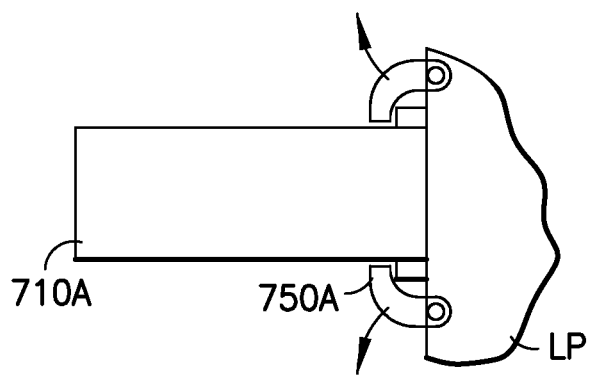
FIGS. 21A-21E are schematic elevation views showing a substrate transport apparatus in accordance with still other different exemplary embodiments.
Figure 21B:
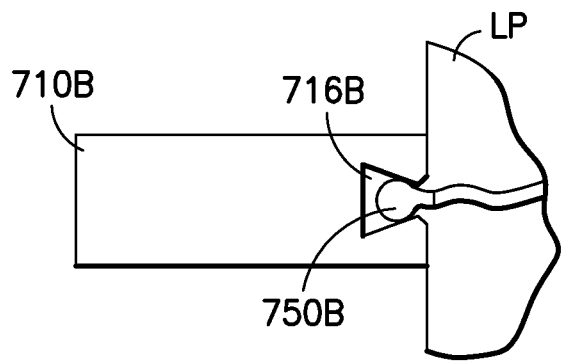
Figure 21C:
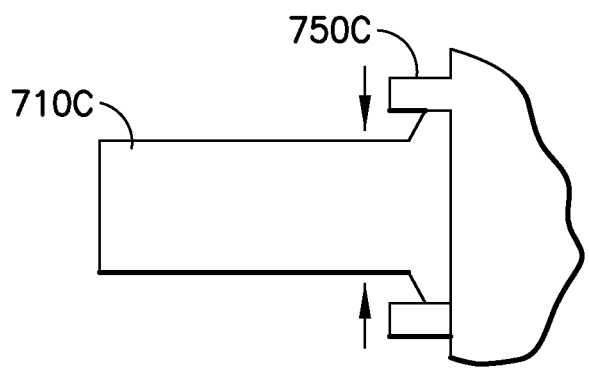
Figure 21D:
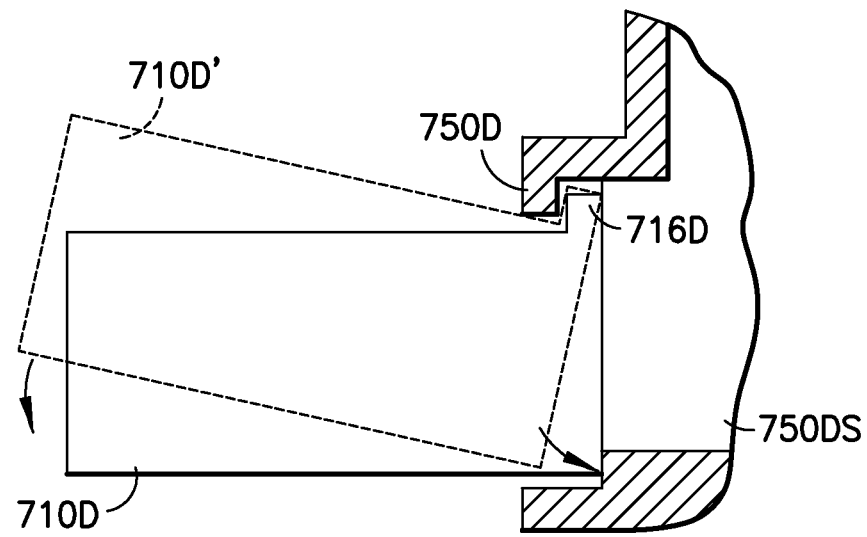
Figure 21E:
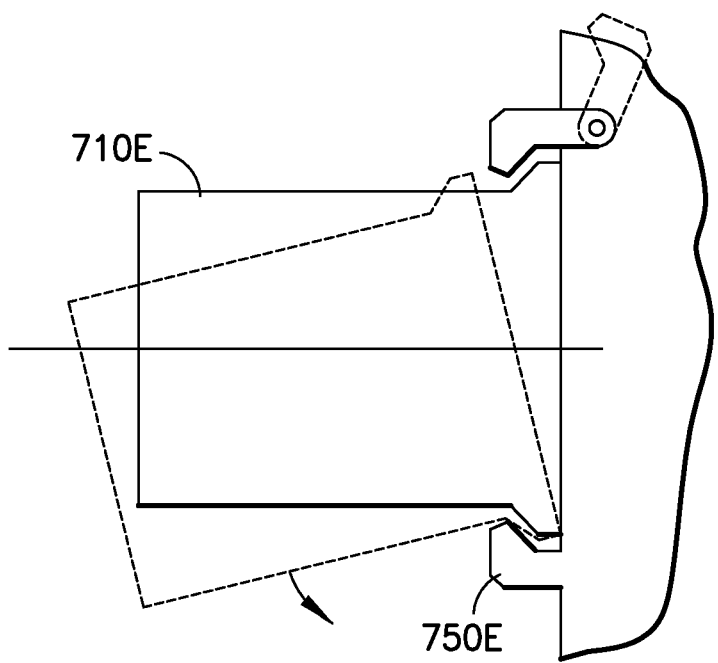

The kinematic coupling between carrier and load port may be an active mechanical coupling (similar to the coupling features illustrated in FIGS. 10, 11). Other exemplary embodiments of active mechanical couplings are shown in FIGS. 21A-21E. In FIG. 21A, the load port has rotating clamp section 750 that engage features on the carrier 710A. In the embodiment shown in FIG. 21B, the load port has an expandable device (e.g. a bladder) that is admitted into a recess/cavity on the carrier 710B. The carrier cavity 716B has dovetailed faces which engage the surface of the expandable device when the device is expanded to the carrier to be drawn against the load port, and register the carrier in the desired position. In the embodiment shown in FIG. 21C, solenoid operated clamps 750C on the load port are moved in an opposing direction against surface of the carrier for registration. FIG. 21D shows another embodiment in which the load port has member 7500D defining a fulcrum for the carrier 710D and a stop surface 750DS against which the carrier comes to rest when registered. The carrier has an engagement lip 716D that rests on the fulcrum provided by member 750D, and the carrier is rotated from entry position 710D' until it rests against stop 750DS. In the embodiment shown in FIG. 21E, the coupling is arranged in a substantially opposite manner to that shown in FIG. 27D, with the fulcrum member 750E on the bottom, and the carrier 710E rotated up into its registered position. In this embodiment, an active hook 750EH is movable mounted on the load port to hold the carrier in the registered position.

Figure 22:
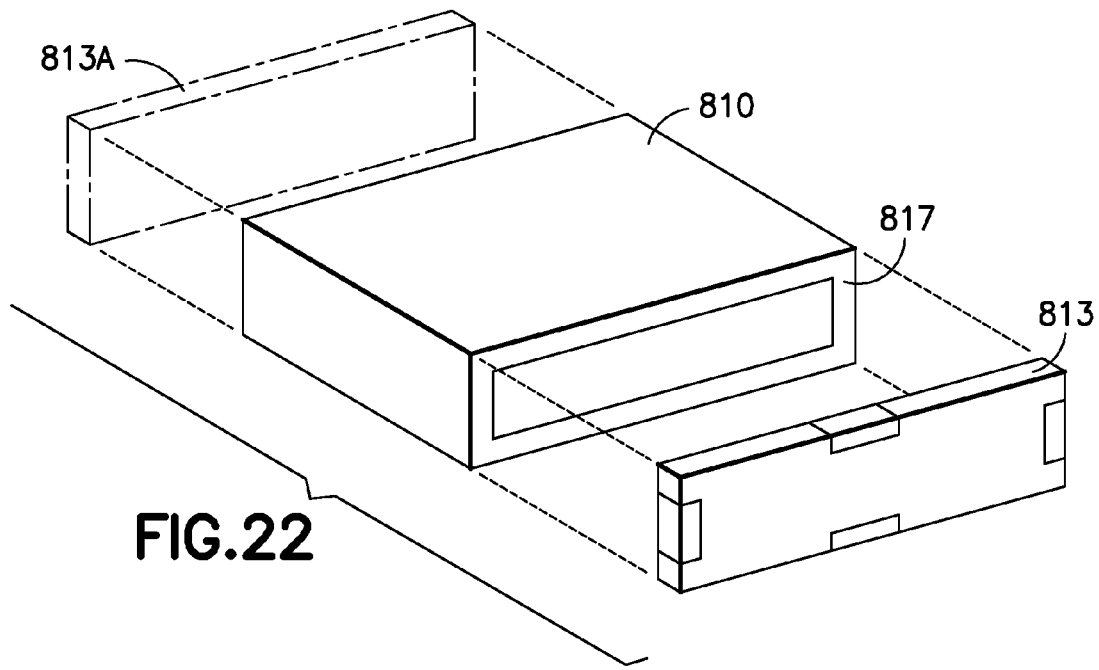
FIGS. 22, 22A-22B are a schematic perspective view and partial elevation views of a substrate transport apparatus in accordance with yet another exemplary embodiment, the transport apparatus being shown in FIGS. 22A-22B in different configurations.
Figure 22A:
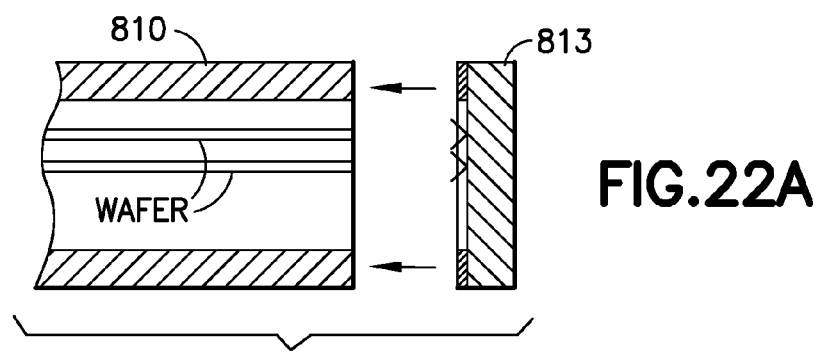
Figure 22B:
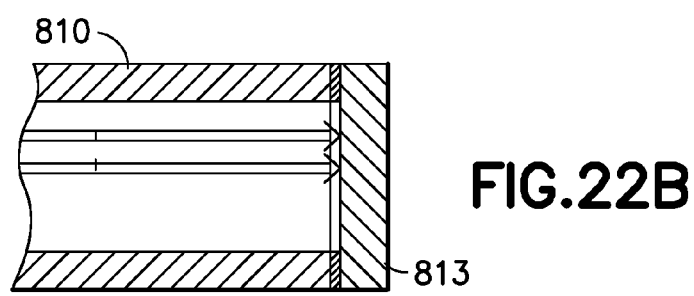

Referring now to FIGS. 22, and 22A-22B there is shown a carrier 810 in accordance with another exemplary embodiment. In this embodiment, the carrier has doors 813, 813A on opposite sides of the carrier. This may allow either side of the carrier to be interfaced to a load port. Suitable couplings, (not shown) may also be provided to allow the carrier to be interfaced with either page. In alternate embodiments the carrier may have more doors. The doors 813, 813A in this embodiment may be secured to the carrier casing with a locking system 818 similar to the permanent/electro-magnetic chuck described before and shown in FIG. 24. In this embodiment the magnetic material may be located in the door 813, 813A. The permanent/electro-magnetic chuck may be located in the carrier casing. As noted before, applying a current to the device, for example when the carrier is docked, activates/deactivates the chuck. FIG. 23 illustrates an embodiment in which the load port carrier door opener LPD haw a permanent electro-magnetic chuck 950 to remove the carrier door 913 from the carrier 910. In this embodiment, the carrier may also be provided with a permanent/electro-magnetic chuck 917 to secure the door on the carrier.

FIG. 25 again schematically shows a representative tool (similar to processing tool PT in FIG. 1A that has a mini-environment ME provided for the interface between processing modules and substrate carriers 1010. As noted before with reference to tool PT in FIG. 1A, the mini-environment ME has a controlled atmosphere with a desired gas species/or mix (e.g. NZ, AR, AR/O2, very dry air that is different from the outside atmosphere. The atmosphere inside the mini-environment may also be different from the atmosphere inside the carrier 1010. To prevent contamination/exposure of the transported wafers to offensive gas species it is desired to prevent contamination of the mini-environment by either outside air or carrier atmosphere, as well as to prevent contamination of the carrier interior with outside atmosphere. By sealing the carrier face to a minienvironment, wafer exposure to potentially offensive gas species may be controlled as indicated in FIG. 25. The sealing may be accomplished with multiple seals (e.g. carrier to carrier door seal 1112, carrier to load port seal 1110 similar to the carrier to loadport seal described before, carrier door to load port door seal 1114 and load port door to load port seal as shown in FIG. 25A) or a single integrated seal. A key may reside in the interface between the carrier and the minienvironment being both (a) front locating and (b) front sealing whereby the locating and engagement action of the carrier also seals the carrier to the minienvironment. Trapped air may be eliminated by zero-volume. Sealing (see FIG. 25B which schematically shows the zero volume interfaces between carrier 1010, carrier door 1013, load port door LPD and load port LP. Trapped air in the case of the non-zero volume interface shown in FIG. 25A, may be eliminated by purging, such as where a valve is cracked from the minienvironment and the mini-environment gas species introduced into the void and evacuated as with an exhaust valve. Alternately, the interior region of the carrier 1010 may also be purged, such as for example by exposing the interior of the carrier to the gas species (e.g. cracking seal 1112, first) before the seal 1116 between the port door LPD and mini-environment LP is opened. Here, when the carrier interior is exposed to the minienvironment, the species that the wafer is exposed to remains the same where the carrier contains that species. In this manner, a carrier may be moved from tool to tool with the gas species that the wafers are being exposed to is effectively controlled. In alternate embodiments, different surfaces may be heated, cooled, charged or otherwise applied to further control particle migration and attraction.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

The invention claimed is:

1. A method of transporting a substrate comprising:
providing a casing adapted to form a controlled environment therein, the casing being sized to hold more than one substrate therein and defining a sealable substrate transfer opening through which substrates are moved in and out of the casing, the casing having holding stations located in the casing so that the casing defines a predetermined substrate transport lot of a predetermined number of substrates, each of the holding stations is capable of holding a substrate where at least one of the holding stations is a substrate holding station holding the substrate when the casing is in a loaded condition where at least one substrate is loaded in the casing so that the casing is loaded with each substrate of the predetermined number of substrates of the predetermined substrate transport lot defined by the casing, and at least another of the holding stations provides a discretionary holding station that is discretionary with respect to the predetermined number of substrates, of the predetermined transport lot defined by the casing;
optionally holding another substrate with the discretionary holding station when the casing is in the loaded condition loaded with each substrate of the predetermined number of substrates of the predetermined transport lot defined by the casing; and
selectably switching each of the at least one holding stations and the at least another holding station between being the substrate holding station and being the discretionary holding station.

2. The method of claim 1, further comprising switching between the states of being the discretionary holding station and the substrate holding station with a controller in communication with at least one of the holding stations.

3. The method of claim 1, further comprising effecting, with a controller, substrate replacement such that the substrate can be placed in each one of the holding stations regardless of original placement of the substrate when removed from the casing for processing.

4. A method for processing substrates with a substrate transport apparatus, the method comprising:
providing the transport apparatus with a casing that forms a controlled environment therein, the casing being sized to hold more than one substrate therein, the casing including a load port interface defining a substrate transfer opening that is closable and through which substrates are moved in and out of the casing;
providing holding stations in the casing so that the casing defines a predetermined substrate transport lot of a predetermined number of substrates and each of the holding stations is capable of holding a substrate;
selecting, with a controller, at least one of the holding stations as a substrate holding station holding the substrate when the transport apparatus is in a loaded condition where at least one substrate is loaded in the transport apparatus so that the casing is loaded with each substrate of the predetermined number of substrates of the predetermined substrate transport lot defined by the casing;

selecting, with the controller, at least another of the holding stations as a discretionary holding station that is discretionary with respect to the predetermined number of substrates of the predetermined transport lot defined by the casing and that changes states between a first state and a second state wherein the discretionary holding station in the first state forms an empty spare holding station upon mating of the casing to a load port and holds another substrate when the transport apparatus is loaded at the load port, wherein the discretionary holding station in the second state is not capable of holding another substrate when the transport apparatus is in a loaded condition loaded with each substrate of the predetermined number of substrates of the predetermined transport lot defined by the casing, and wherein each of the at least one holding station is selectably switchable between being the substrate holding station and the discretionary holding station.

5. The method of claim 4, further comprising selectably switching the at least one holding station to effect changing a substrate processing lot size.

6. The method of claim 5, wherein the substrate processing lot size is increased by selectably switching the at least one holding station.

7. The method of claim 4, further comprising selectably switching the at least one holding station to effect generation of a virtual substrate processing lot when the transport apparatus is loaded with substrates.

8. The method claim 7, wherein the virtual substrate processing lot is formed by the substrate in the substrate holding station and the other substrate in the discretionary holding station, the substrate and the other substrate being from different processing lots.

9. The method of claim 4, further comprising defining a substrate buffer in the transport apparatus with the discretionary holding station.

10. The method of claim 4, further comprising effecting, with the controller, substrate replacement such that the substrate can be placed in each one of the holding stations regardless of original placement of the substrate when removed from the casing for processing.

11. The method of claim 4, further comprising switching between being the discretionary holding station and the substrate holding station with a controller in communication with each of the at least one holding station.

* * * * *